US012393118B2

(12) United States Patent
Lee et al.

(10) Patent No.: US 12,393,118 B2
(45) Date of Patent: Aug. 19, 2025

(54) COMPOSITION FOR PHOTORESIST UNDERLAYER

(71) Applicants: ROHM AND HAAS ELECTRONIC MATERIALS KOREA LTD., Cheonan-si (KR); ROHM AND HAAS ELECTRONIC MATERIALS LLC, Marlborough, MA (US)

(72) Inventors: Jung June Lee, Hwaseong-si (KR); Jae Hwan Sim, Hwaseong-si (KR); Suwoong Kim, Hwaseong-si (KR); Jin Hong Park, Hwaseong-si (KR); Bhooshan Popere, Sturbridge, MA (US)

(73) Assignees: DUPONT ELECTRONIC MATERIALS INTERNATIONAL, LLC, Marlborough, MA (US); DUPONT SPECIALTY MATERIALS KOREA LTD, Chungcheongnam-Do (KR)

( * ) Notice: Subject to any disclaimer, the term of this patent is extended or adjusted under 35 U.S.C. 154(b) by 176 days.

(21) Appl. No.: 17/333,622

(22) Filed: May 28, 2021

(65) Prior Publication Data
US 2022/0397827 A1 Dec. 15, 2022

(51) Int. Cl.
*G03F 7/11* (2006.01)
*C08F 220/24* (2006.01)
*C08G 18/81* (2006.01)
*C09D 175/04* (2006.01)

(52) U.S. Cl.
CPC ............ *G03F 7/11* (2013.01); *C08F 220/24* (2013.01); *C08G 18/8108* (2013.01); *C09D 175/04* (2013.01)

(58) Field of Classification Search
CPC . G03F 7/11; G03F 7/094; G03F 7/091; G03F 7/004; C08F 220/24; C08F 212/26; C08F 212/30; C08G 18/8108; C09D 175/04
See application file for complete search history.

(56) References Cited

U.S. PATENT DOCUMENTS

| 4,596,763 | A | * | 6/1986 | DiCarlo | G03F 7/022 430/326 |
| 7,838,199 | B2 | * | 11/2010 | Thackeray | G03F 7/0397 430/326 |
| 8,455,176 | B2 | | 6/2013 | Houlihan et al. | |
| 8,507,176 | B2 | * | 8/2013 | Thackeray | G03F 7/0045 430/326 |
| 8,900,792 | B2 | * | 12/2014 | Thackeray | C07D 333/76 430/326 |
| 9,146,467 | B2 | | 9/2015 | Houlihan et al. | |
| 9,244,352 | B2 | | 1/2016 | Zampini et al. | |
| 9,606,434 | B2 | | 3/2017 | Labeaume et al. | |
| 9,983,477 | B2 | * | 5/2018 | Thackeray | G03F 7/0382 |
| 2006/0189779 | A1 | * | 8/2006 | Allen | C08G 77/045 430/272.1 |
| 2011/0159429 | A1 | * | 6/2011 | Thackeray | G03F 7/0397 430/311 |
| 2012/0088192 | A1 | * | 4/2012 | Trefonas | G03F 7/168 430/285.1 |
| 2016/0187778 | A1 | * | 6/2016 | Lee | G03F 7/325 430/271.1 |
| 2017/0199459 | A1 | | 7/2017 | Ryu et al. | |
| 2017/0248844 | A1 | | 8/2017 | Aqad et al. | |
| 2019/0129305 | A1 | | 5/2019 | Lee et al. | |
| 2021/0026242 | A1 | | 1/2021 | Lee et al. | |
| 2021/0200093 | A1 | * | 7/2021 | Park | C08G 63/6856 |

FOREIGN PATENT DOCUMENTS

| KR | 20150077949 A | 7/2015 |
| WO | 2011018928 A1 | 2/2011 |
| WO | 2022244682 A1 | 11/2022 |

OTHER PUBLICATIONS https://pubchem.ncbi.nlm.nih.gov/compound/Tris_2-hydroxyethyl_-isocyanurate (Year: 2023).*
"Top coat or no top coat for immersion lithography?", N. Stepanenko, Hyun-Woo Kim, S. Kishimura, D. Van Den Heuvel, N. Vandenbroeck, Proc. SPIE 6153, Advances in Resist Technology and Processing XXIII, 615304 (Mar. 29, 2006); https://doi.org/ 10.1117/12.660158 (Year: 2006).*
Houben-Weyl, "Methoden der Organischen Chemie, Band E20, Makromolekulare Soffe, Polyester," (Georg Thieme Verlag, Stuttgart 1987), 44 pages, English Translation.
Wicks et al., "Organic Coatings, Science and Technology," pp. 246-257. 1999, second edition.

* cited by examiner

*Primary Examiner* — Jonathan Johnson
*Assistant Examiner* — Alexander N. Lee
(74) *Attorney, Agent, or Firm* — CANTOR COLBURN LLP

(57) ABSTRACT

A photoresist underlayer composition, comprising: a first polymer comprising a crosslinkable group; a second polymer comprising: a first repeating unit comprising a repeating unit comprising a photoacid generator, and a second repeating unit comprising a hydroxy-substituted $C_{1-30}$ alkyl group, a hydroxy-substituted $C_{3-30}$ cycloalkyl group, or a hydroxy-substituted $C_{6-30}$ aryl group; an acid catalyst; and a solvent.

15 Claims, No Drawings

COMPOSITION FOR PHOTORESIST UNDERLAYER

FIELD

The present invention relates generally to field of manufacturing electronic devices, and more specifically to the field of materials for use in semiconductor manufacture.

BACKGROUND

Photoresist underlayer compositions are used in the semiconductor industry as etch masks for lithography in advanced technology nodes for integrated circuit manufacturing. These compositions are often used in tri-layer and quad-layer photoresist integration schemes, where an organic or silicon containing anti-reflective coating and a patternable photoresist film layers are disposed on the bottom layer having a high carbon content.

When a chemically amplified photoresist composition for ArF or extreme ultraviolet (EUV) lithography is prepared using a resin that may include by-products, the number of defects (surface defects) in the resist pattern following developing can become problematic, even if properties as the sensitivity, the resolution, and the resist pattern shape are satisfactory. These surface defects refer to problems such as scum and bridging between resist patterns.

EUV lithography is a leading technology to replace optical lithography for volume semiconductor manufacturing at feature sizes of several nanometers. Currently, EUV lithography has become the preferred patterning technology over 193 nm immersion processes for high volume manufacturing for product nodes under 10 nm. In EUV lithography, there are fewer photons at the exposed areas than in the exposed areas of ArF lithography. Due to the lack of photons and shrunken pitches of patterns, impact of shot noise becomes more significant on pattern profiles. Scum and bridging defects between resist patterns, such as a nano-bridging defect at line to space patterns with 3×nm pitch, may cause fatal bridging defects after whole pattern transfer by an etching process.

Accordingly, there remains a need for new photoresist underlayer materials that can mitigate scum and bridge defects in photoresists for ArF and EUV lithography.

SUMMARY

An aspect provides a photoresist underlayer composition comprising: a first polymer comprising a crosslinkable group; a second polymer comprising: a first repeating unit comprising a repeating unit comprising a photoacid generator, and a second repeating unit comprising a hydroxy-substituted $C_{1-30}$ alkyl group, a hydroxy-substituted $C_{3-30}$ cycloalkyl group, or a hydroxy-substituted $C_{6-30}$ aryl group; an acid catalyst; and a solvent.

Also provided is a coated substrate comprising: a cured layer of the inventive photoresist underlayer composition disposed on a substrate; and a photoresist layer disposed on the cured layer of the photoresist underlayer composition.

Another aspect provides a method of forming a pattern comprising applying a layer of the inventive photoresist underlayer composition on a substrate; curing the applied layer of the photoresist underlayer composition to form an underlayer film; applying a layer of a photoresist composition on the underlayer film to form a photoresist layer; pattern-wise exposing the applied photoresist layer to activating radiation; and developing the exposed photoresist layer to provide a resist relief image.

DETAILED DESCRIPTION

Reference will now be made in detail to exemplary embodiments, examples of which are illustrated in the present description. In this regard, the present exemplary embodiments may have different forms and should not be construed as being limited to the descriptions set forth herein. Accordingly, the exemplary embodiments are merely described below, by referring to the FIGURES, to explain aspects of the present description. As used herein, the term "and/or" includes all combinations of one or more of the associated listed items. Expressions such as "at least one of," when preceding a list of elements, modify the entire list of elements and do not modify the individual elements of the list.

As used herein, the terms "a," "an," and "the" do not denote a limitation of quantity and are to be construed to cover both the singular and the plural, unless otherwise indicated herein or clearly contradicted by context. "Or" means "and/or" unless clearly indicated otherwise. All ranges disclosed herein are inclusive of the endpoints, and the endpoints are independently combinable with each other. The suffix "(s)" is intended to include both the singular and the plural of the term that it modifies, thereby including at least one of that term. "Optional" or "optionally" means that the subsequently described event or circumstance can or cannot occur, and that the description includes instances where the event occurs and instances where it does not. The terms "first," "second," and the like, herein do not denote an order, quantity, or importance, but rather are used to distinguish one element from another. When an element is referred to as being "on" another element, it may be directly in contact with the other element or intervening elements may be present therebetween. In contrast, when an element is referred to as being "directly on" another element, there are no intervening elements present. It is to be understood that the described components, elements, limitations, and/or features of aspects may be combined in any suitable manner in the various aspects.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, the term "hydrocarbon group" refers to an organic compound having at least one carbon atom and at least one hydrogen atom, optionally substituted with one or more substituents where indicated; "alkyl group" refers to a straight or branched chain saturated hydrocarbon having the specified number of carbon atoms and having a valence of one; "alkylene group" refers to an alkyl group having a valence of two; "hydroxyalkyl group" refers to an alkyl group substituted with at least one hydroxyl group (—OH); "alkoxy group" refers to "alkyl-O—"; "carboxylic acid group" refers to a group having the formula "—C(=O)—OH"; "cycloalkyl group" refers to a monovalent group having one or more saturated rings in which all ring members are carbon; "cycloalkylene group" refers to a cycloalkyl group having a valence of two; "alkenyl group" refers to a straight or branched chain, monovalent hydrocarbon group having at least one carbon-carbon double bond; "alkenoxy group" refers to "alkenyl-O—"; "alkenylene group" refers to an alkenyl group having a valence of at least two; "cycloalkenyl group" refers to a cycloalkyl group having at least one carbon-carbon double bond; "alkynyl group" refers to a monovalent hydrocarbon group having at least one carbon-carbon triple bond; the term "aromatic group" denotes the conventional idea of aromaticity as defined in the literature, in particular in IUPAC 19, and refers to a monocyclic or polycyclic aromatic ring system that includes carbon atoms in the ring or rings, and optionally may include one or more heteroatoms independently selected from N, O, and S instead of a carbon atom or carbon atoms in the ring or rings; "aryl group" refers to a monovalent, monocyclic or polycyclic aromatic group containing only carbon atoms in the aromatic ring or rings, and may include a group with an aromatic ring fused to at least one cycloalkyl or heterocycloalkyl ring; "arylene group" refers to an aryl group having a valence of at least two; "alkylaryl group" refers to an aryl group that has been substituted with an alkyl group; "arylalkyl group" refers to an alkyl group that has been substituted with an aryl group; "aryloxy group" refers to "aryl-O—"; and "arylthio group" refers to "aryl-S—".

The prefix "hetero" means that the compound or group includes at least one member that is a heteroatom (e.g., 1, 2, 3, or 4 or more heteroatom(s)) instead of a carbon atom, wherein the heteroatom(s) is each independently selected from N, O, S, Si, or P; "heteroatom-containing group" refers to a substituent group that includes at least one heteroatom; "heteroalkyl group" refers to an alkyl group having 1-4 heteroatoms instead of carbon atoms; "heterocycloalkyl group" refers to a cycloalkyl group with one or more N, O or S atoms instead of carbon atoms; "heterocycloalkylene group" refers to a heterocycloalkyl group having a valence of at least two; "heteroaryl group" refers to an aryl group having 1 to 3 separate or fused rings with one or more N, O or S atoms as ring members instead of carbon atoms; and "heteroarylene group" refers to a heteroaryl group having a valence of at least two.

The term "halogen" means a monovalent substituent that is fluorine (fluoro), chlorine (chloro), bromine (bromo), or iodine (iodo). The prefix "halo" means a group including one more of a fluoro, chloro, bromo, or iodo substituent instead of a hydrogen atom. A combination of halo groups (e.g., bromo and fluoro), or only fluoro groups may be present.

The symbol "*" represents a bonding site (i.e., point of attachment) of a repeating unit.

"Substituted" means that at least one hydrogen atom on the group is replaced with another group, provided that the designated atom's normal valence is not exceeded. When the substituent is oxo (i.e., =O), then two hydrogens on the carbon atom are replaced. Combinations of substituents or variables are permissible. Exemplary groups that may be present on a "substituted" position include, but are not limited to, nitro (—$NO_2$), cyano (—CN), hydroxyl (—OH), oxo (=O), amino (—$NH_2$), mono- or di-($C_{1-6}$)alkylamino, alkanoyl (such as a $C_{2-6}$ alkanoyl group such as acyl), formyl (—C(=O)H), carboxylic acid or an alkali metal or ammonium salt thereof, $C_{2-6}$ alkyl ester (—C(=O)O-alkyl or —OC(=O)-alkyl), $C_{7-13}$ aryl ester (—C(=O)O-aryl or —OC(=O)-aryl), amido (—C(=O)$NR_2$ wherein R is hydrogen or $C_{1-6}$ alkyl), carboxamido (—$CH_2$C(=O)$NR_2$ wherein R is hydrogen or $C_{1-6}$ alkyl), halogen, thiol (—SH), $C_{1-6}$ alkylthio (—S-alkyl), thiocyano (—SCN), $C_{1-6}$ alkyl, $C_{2-6}$ alkenyl, $C_{2-6}$ alkynyl, $C_{1-6}$ haloalkyl, $C_{1-9}$ alkoxy, $C_{1-6}$ haloalkoxy, $C_{3-12}$ cycloalkyl, $C_{5-18}$ cycloalkenyl, $C_{6-12}$ aryl having at least one aromatic ring (e.g., phenyl, biphenyl, naphthyl, or the like, each ring either substituted or unsubstituted aromatic), $C_{7-19}$ arylalkyl having 1 to 3 separate or fused rings and from 6 to 18 ring carbon atoms, arylalkoxy having 1 to 3 separate or fused rings and from 6 to 18 ring carbon atoms, $C_{7-12}$ alkylaryl, $C_{4-12}$ heterocycloalkyl, $C_{3-12}$ heteroaryl, $C_{1-6}$ alkyl sulfonyl (—S(=O)$_2$-alkyl), $C_{6-12}$ arylsulfonyl (—S(=O)$_2$-aryl), or tosyl ($CH_3C_6H_4SO_2$—). When a group is substituted, the indicated number of carbon atoms is the total number of carbon atoms in the group, excluding those of any substituents. For example, the group —$CH_2CH_2$CN is a $C_2$ alkyl group substituted with a cyano group.

As used herein, the term "polymer" refers to a polymeric compound containing one or more repeating units, where each of the repeating units may be the same or different from each other for the case when there are two or more repeating units present. Thus, the disclosed polymers of the invention can be referred to herein as a "polymer" or a "copolymer."

In positive tone development (PTD) processes using EUV or ArF lithography, scum and bridging defects of line and space (L/S) patterns are an increasingly important factor for high energy latitude (EL) and wide depth of focus (DoF) margins. The scum and bridge defects may be dependent on the film properties of EUV underlayers, including any bottom antireflective coating (BARC) layers. As acidic catalysts, photoacid generators (PAGs) in EUV underlayer/BARC formulations can be used to control acidity and improve scum and bridging defects in exposed areas. However, a significant disadvantage to this approach is the loss of material through film stripping by solvents that are present during photoresist coating, in addition to decreased film uniformity (i.e., worse film uniformity) due to polarity mismatching with EUV underlayer/BARC polymers.

The present inventors have discovered that EUV underlayer and/or BARC formulations including a polymer-bound PAG can reduce the extent of film stripping loss through a cross-linking reaction with a crosslinkable polymer during a baking step to form a cross-linked polymer. In addition, the number of scum and bridging defects can be reduced via the photoacid generation from the cross-linked polymer during subsequent exposure of the photoresist.

According to an aspect, a photoresist underlayer composition includes a first polymer comprising a crosslinkable group; a second polymer including a first repeating unit comprising a repeating unit comprising a photoacid generator, and a second repeating unit comprising a hydroxy-substituted $C_{1-30}$ alkyl group, a hydroxy-substituted $C_{3-30}$ cycloalkyl group, or a hydroxy-substituted $C_{6-30}$ aryl group; an acid catalyst; and a solvent.

In an embodiment, the first polymer may be a crosslinkable polyester polymer that includes a crosslinkable group. For example, the first polymer may include an isocyanurate repeating unit and a crosslinkable group. In some aspects, the crosslinkable group may be selected from hydroxyl, carboxyl, thiol, amino, epoxy, alkoxy, amido, vinyl, or a combination thereof.

It is preferred that the first polymer include one or more isocyanurate repeating units derived from a monomer of formula (1):

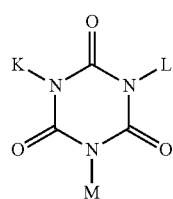

(1)

In formula (1), K, L, and M are each independently a linear or branched $C_{1-10}$ hydrocarbon group, a $C_{1-10}$ alkoxycarbonyl group, a $C_{1-10}$ alkanoyloxy group, each of which is optionally substituted with a carboxylic acid group, or a linear or branched $C_{1-10}$ hydroxyalkyl group optionally substituted with a $C_{1-5}$ alkoxycarbonyl group or a $C_{1-5}$ substituted alkoxy group.

In formula (1), for K, L, and M, each of the $C_{1-10}$ hydrocarbon group, the $C_{1-10}$ alkoxycarbonyl group, the $C_{1-10}$ alkanoyloxy group, and the $C_{1-10}$ hydroxyalkyl group may be optionally substituted with at least one of a halogen, an amino group, a thiol group, an epoxy group, an amido group, a $C_{1-5}$ alkyl group, a $C_{3-8}$ cycloalkyl group, a $C_{3-20}$ heterocycloalkyl group, a $C_{2-5}$ alkenyl group, a $C_{1-5}$ alkoxy group, a $C_{2-5}$ alkenoxy group, a $C_{6-12}$ aryl group, a $C_{6-12}$ aryloxy group, a $C_{7-13}$ alkylaryl group, or $C_{7-13}$ alkylaryloxy group. The $C_{3-8}$ cycloalkyl group and the $C_{3-20}$ heterocycloalkyl group may be optionally substituted on at least one ring carbon atom with an oxo group (=O). At least one hydrogen atom of the first polymer derived from the monomer of formula (2) is substituted with a functional group independently chosen from hydroxyl, carboxyl, thiol, amino, epoxy, alkoxy, amido, vinyl, and a combination thereof. Of these, hydroxyl, carboxyl, or alkoxy are preferred.

The first polymer may be formed by conventional polycondensation techniques such as for example described in Zeno W. Wicks, Jr, Frank N. Jones, S. Peter Pappas, "Organic Coatings, Science and Technology," pp 246-257 (John Wiley & Sons, 1999, second edition) and references therein or in Houben-Weyl, "Methoden der Organischen Chemie, Band E20, Makromolekulare Soffe, Polyester," pp 1405-1429. (Georg Thieme Verlag, Stuttgart 1987) and references therein. In one aspect, a diol or polyol and a di-carboxylic acid or polycarboxylic acid are charged into a conventional polymerization vessel and reacted between about 150 and 280° C. for several hours. Optionally, an esterification catalyst may be used to decrease the reaction time. It is also understood that an esterifiable derivative of a polycarboxylic acid, such as a dimethyl ester or anhydride of a polycarboxylic acid, can be used to prepare the polyester. Exemplary polyols and polycarboxylic acids include isocyanurate polyols and isocyanurate polycarboxylic acids. The polyester polymers can be linear or branched.

Suitable diols and polyols include, but are not limited to, ethylene glycol, diethylene glycol, triethylene glycol and higher polyethylene glycols, propylene glycol, dipropylene glycol, tripropylene glycol and higher polypropylene glycols, 1,3-propanediol, 1,4-butanediol and other butanediols, 1,5-pentanediol and other pentane diols, hexanediols, decanediols, and dodecanediols, glycerol, trimethylolpropane, trimethylolethane, neopentyl glycol, pentaerythritol, cyclohexanedimethanol, dipentaerythtritol, 1, 2-methyl-1,3-propanediol, 1,4-benzyldimethanol, 2,4-dimethyl-2-ethyl-hexane-1,3-diol, isopropylidene bis (p-phenylene-oxypropanol-2), 4,4'-dihydroxy-2,2'-diphenylpropane, 1,3-cyclohexanedimethanol, 1,4-cyclohexanedimethanol (or mixtures of 1,3 and 1,4 cyclohexanedimethanol, may be cis or trans), sorbitol, or the like, or combinations thereof.

The first polymer may optionally include one or more additional repeating unit(s) different from the repeating unit comprising formula (1). The additional repeating units may include, for example, one or more additional units for purposes of adjusting properties of the photoresist composition, such as etch rate and solubility. Exemplary additional units may include one or more of (meth)acrylate, vinyl ether, vinyl ketone, and vinyl ester. The one or more additional repeating units if present in the polymer are typically used in an amount of up to 99 mol %, and typically from 3 to 80 mol %, based on total repeating units of the polymer.

Preferably, the first polymer of the invention will have a weight average molecular weight (Mw) of 1,000 to 100,000 grams per mole (g/mol), more typically 2,000 to 30,000 g/mol, and a number average molecular weight (Mn) of 500 to 1,000,000 g/mol. Molecular weights (either $M_w$ or $M_n$) are suitably determined by gel permeation chromatography (GPC).

The second polymer includes a first repeating unit comprising a repeating unit comprising a photoacid generator; and a second repeating unit comprising a hydroxy-substituted $C_{1-30}$ alkyl group, a hydroxy-substituted $C_{3-30}$ cycloalkyl group, or a hydroxy-substituted $C_{6-30}$ aryl group. The second polymer may optionally include a third repeating unit comprising an unsubstituted $C_{1-30}$ alkyl group, a fluorine-substituted $C_{1-30}$ alkyl group, a $C_{1-30}$ alkyl group substituted with a polymerizable group, a $C_{3-30}$ cycloalkyl group substituted with a polymerizable group, or a $C_{6-30}$ aryl group substituted with a polymerizable group, wherein the polymerizable group is reactive to self-crosslink the second polymer.

It is preferred that the first repeating unit of the second polymer comprises a repeating unit derived from a monomer of formula (2):

(2)

In formula (2), $R^a$ is hydrogen, fluorine, cyano, a substituted or unsubstituted $C_{1-10}$ alkyl, or a substituted or unsubstituted $C_{1-10}$ fluoroalkyl. Preferably, $R^a$ is hydrogen, fluorine, or substituted or unsubstituted $C_{1-5}$ alkyl, typically methyl.

In formula (2), $L^1$ is a single bond or a divalent linking group. Typically, $L^1$ is a single bond or a divalent linking group chosen from one or more of a substituted or unsubstituted heteroatom, substituted or unsubstituted $C_{1-30}$ alkylene, substituted or unsubstituted $C_{3-30}$ cycloalkylene, substituted or unsubstituted $C_{1-30}$ heterocycloalkylene, substituted or unsubstituted $C_{6-30}$ arylene, substituted or unsubstituted divalent $C_{7-30}$ arylalkyl, substituted or unsubstituted $C_{1-30}$ heteroarylene, or substituted or unsubstituted divalent $C_{3-30}$ heteroarylalkyl, or a combination thereof. For example, the substituted or unsubstituted heteroatom may be chosen from —O—, —C(O)—, —N(R)—, —S—, —S(O)$_2$— wherein R is hydrogen or $C_{1-6}$ alkyl. Preferably, $L^1$ is a single bond, —O—, or —C(O)—.

In formula (2), A is a divalent linking group. Typically, A is a divalent linking group chosen from one or more of substituted or unsubstituted $C_{1-30}$ alkylene, substituted or unsubstituted $C_{3-30}$ cycloalkylene, substituted or unsubstituted $C_{1-30}$ heterocycloalkylene, substituted or unsubstituted $C_{6-30}$ arylene, substituted or unsubstituted divalent $C_{7-30}$ arylalkyl, substituted or unsubstituted $C_{1-30}$ heteroarylene, substituted or unsubstituted divalent $C_{3-30}$ heteroarylalkyl, or a combination thereof. Preferably, A is substituted or unsubstituted $C_{1-30}$ alkylene or substituted or unsubstituted $C_{6-30}$ arylene.

In formula (2), $Z^-$ is an anionic moiety comprising sulfonate, an anion of a sulfonamide, an anion of a sulfonimide, or a methide anion. $G^+$ is an organic cation as described below.

In some embodiments, the structure represented by -$L^1$-A-$Z^-$ in formula (2) may be a group represented by one of formulae (3) to (5):

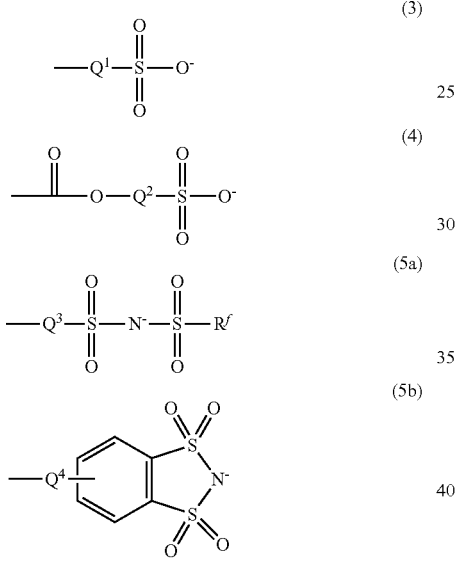

In formula (3), $Q^1$ is a fluorine-substituted divalent linking group. Typically, $Q^1$ is a fluorine-substituted divalent linking group comprising one or more of substituted or unsubstituted $C_{1-30}$ alkylene, substituted or unsubstituted $C_{3-30}$ cycloalkylene, substituted or unsubstituted $C_{1-30}$ heterocycloalkylene, substituted or unsubstituted $C_{6-30}$ arylene, substituted or unsubstituted divalent $C_{7-30}$ arylalkyl, substituted or unsubstituted $C_{1-30}$ heteroarylene, or substituted or unsubstituted divalent $C_{3-30}$ heteroarylalkyl, and optionally further comprising one or more of —O—, or —C(O)—. Preferably, $Q^1$ is a fluorine-substituted divalent linking group comprising substituted or unsubstituted $C_{1-30}$ alkylene and one or more of —O—, or —C(O)—.

In formula (4), $Q^2$ is a fluorine-substituted divalent linking group. Typically, $Q^2$ is a fluorine-substituted divalent linking group comprising one or more of substituted or unsubstituted $C_{1-30}$ alkylene, substituted or unsubstituted $C_{3-30}$ cycloalkylene, substituted or unsubstituted $C_{1-30}$ heterocycloalkylene, substituted or unsubstituted $C_{6-30}$ arylene, substituted or unsubstituted divalent $C_{7-30}$ arylalkyl, substituted or unsubstituted $C_{1-30}$ heteroarylene, or substituted or unsubstituted divalent $C_{3-30}$ heteroarylalkyl, and optionally further comprising one or more of —O—, or —C(O)—. Preferably, $Q^2$ is a fluorine-substituted divalent linking group comprising substituted or unsubstituted $C_{1-30}$ alkylene.

In formula (5a), $Q^3$ is a divalent linking group. Typically, $Q^3$ is a divalent linking group comprising one or more of substituted or unsubstituted $C_{1-30}$ alkylene, substituted or unsubstituted $C_{3-30}$ cycloalkylene, substituted or unsubstituted $C_{1-30}$ heterocycloalkylene, substituted or unsubstituted $C_{6-30}$ arylene, substituted or unsubstituted divalent $C_{7-30}$ arylalkyl, substituted or unsubstituted $C_{1-30}$ heteroarylene, or substituted or unsubstituted divalent $C_{3-30}$ heteroarylalkyl, and optionally further comprising one or more of —O—, or —C(O)—. Preferably, $Q^3$ is a divalent linking group comprising substituted or unsubstituted $C_{1-30}$ alkylene or substituted or unsubstituted $C_{6-30}$ arylene.

In formula (5a), $R^f$ is a fluorine-substituted $C_{1-30}$ alkyl, a fluorine-substituted $C_{3-30}$ cycloalkyl, or a single bond forming a ring with $Q^3$. Preferably, $R^f$ is a fluorine-substituted $C_{1-10}$ alkyl group.

In formula (5b), $Q^4$ is a single bond or a divalent linking group. Typically, $Q^4$ is a single bond or a divalent linking group comprising one or more of substituted or unsubstituted $C_{1-30}$ alkylene, substituted or unsubstituted $C_{3-30}$ cycloalkylene, substituted or unsubstituted $C_{1-30}$ heterocycloalkylene, substituted or unsubstituted $C_{6-30}$ arylene, substituted or unsubstituted divalent $C_{7-30}$ arylalkyl, substituted or unsubstituted $C_{1-30}$ heteroarylene, or substituted or unsubstituted divalent $C_{3-30}$ heteroarylalkyl, and optionally further comprising one or more of —O—, or —C(O)—. Preferably, $Q^4$ is a single bond.

Exemplary monomers of formula (2) include the following:

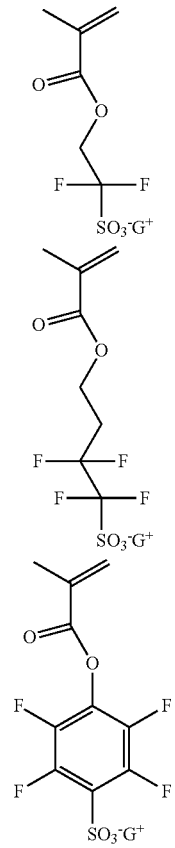

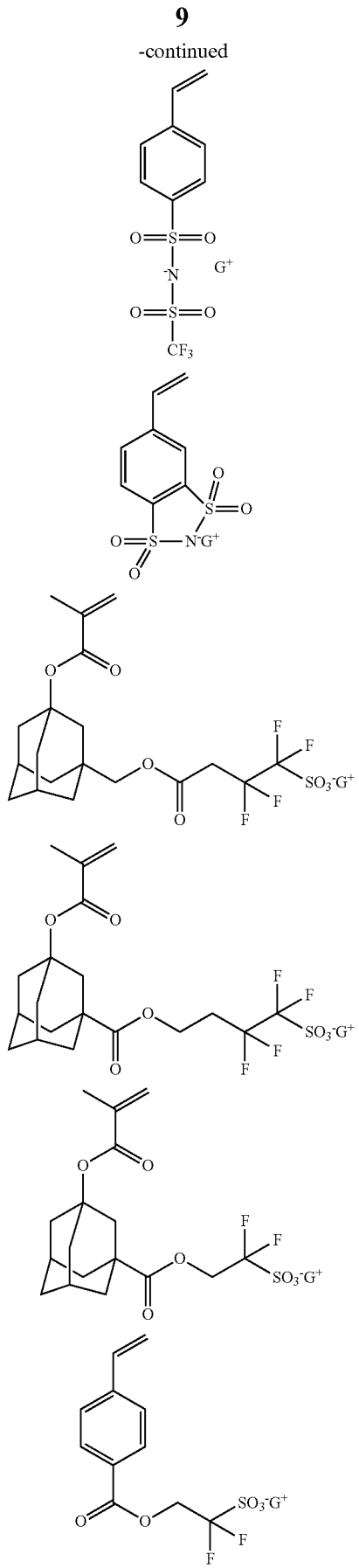

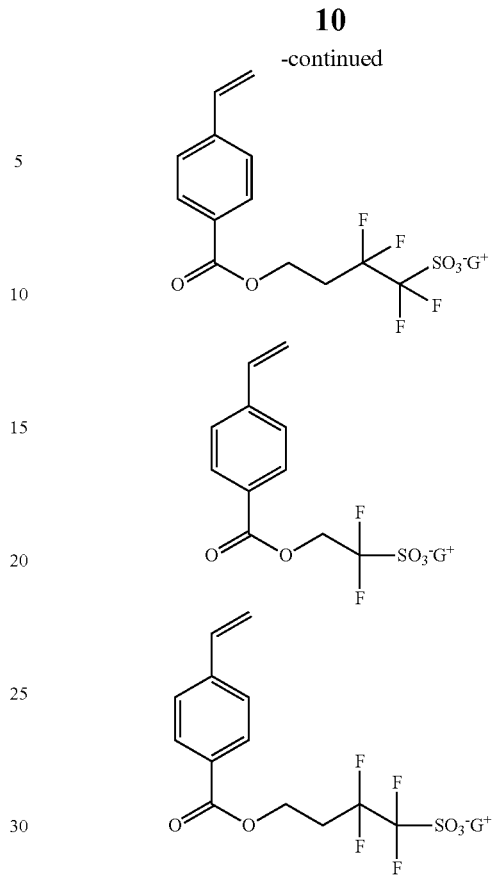

wherein G⁺ is an organic cation. Organic cations include, for example, iodonium cations substituted with two alkyl groups, aryl groups, or a combination of alkyl and aryl groups; and sulfonium cations substituted with three alkyl groups, aryl groups, or a combination of alkyl and aryl groups.

In an embodiment, the organic cation G⁺ is represented by one of formulae (6), (7), or (8):

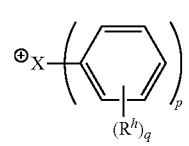

(6)

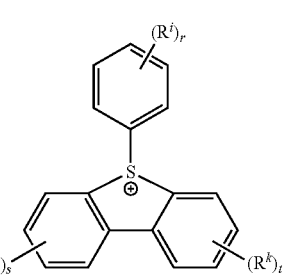

(7)

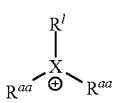

(8)

In formulae (6), (7), and (8), X is I or S.

In formulae (6), (7), and (8), $R^h$, $R^i$, $R^j$, and $R^k$ are each independently hydroxy, nitrile, halogen, substituted or unsubstituted $C_{1-30}$ alkyl, substituted or unsubstituted $C_{1-30}$ fluoroalkyl, substituted or unsubstituted $C_{3-30}$ cycloalkyl, substituted or unsubstituted $C_{1-30}$ fluorocycloalkyl, substituted or unsubstituted $C_{1-30}$ alkoxy, substituted or unsubstituted $C_{3-30}$ alkoxycarbonylalkyl, substituted or unsubstituted $C_{3-30}$ alkoxycarbonylalkoxy, substituted or unsubstituted $C_{3-30}$ cycloalkoxy, substituted or unsubstituted $C_{5-30}$ cycloalkoxycarbonylalkyl, substituted or unsubstituted $C_{5-30}$ cycloalkoxycarbonylalkoxy, substituted or unsubstituted $C_{1-30}$ fluoroalkoxy, substituted or unsubstituted $C_{3-30}$ fluoroalkoxycarbonylalkyl, substituted or unsubstituted $C_{3-30}$ fluoroalkoxycarbonylalkoxy, substituted or unsubstituted $C_{3-30}$ fluorocycloalkoxy, substituted or unsubstituted $C_{5-30}$ fluorocycloalkoxycarbonylalkyl, substituted or unsubstituted $C_{5-30}$ fluorocycloalkoxycarbonylalkoxy, substituted or unsubstituted $C_{6-30}$ aryl, $C_{6-30}$ fluoroaryl, substituted or unsubstituted $C_{6-30}$ aryloxy, or substituted or unsubstituted $C_{6-30}$ fluoroaryloxy. Preferably, one or more of $R^h$, $R^i$, $R^j$, and $R^k$ is hydroxy, halogen, substituted or unsubstituted $C_{1-30}$ alkyl, substituted or unsubstituted $C_{3-30}$ alkoxycarbonylalkoxy, substituted or unsubstituted $C_{5-30}$ cycloalkoxycarbonylalkoxy, or a combination thereof.

In formula (8), each $R^{aa}$ is independently substituted or unsubstituted $C_{1-20}$ alkyl, substituted or unsubstituted $C_{1-20}$ fluoroalkyl, substituted or unsubstituted $C_{3-20}$ cycloalkyl, substituted or unsubstituted $C_{3-20}$ fluorocycloalkyl, substituted or unsubstituted $C_{2-20}$ alkenyl, substituted or unsubstituted $C_{2-20}$ fluoroalkenyl, substituted or unsubstituted $C_{6-30}$ aryl group, substituted or unsubstituted $C_{6-30}$ fluoroaryl, substituted or unsubstituted $C_{6-30}$ iodoaryl, substituted or unsubstituted $C_{4-30}$ heteroaryl, substituted or unsubstituted $C_{7-20}$ arylalkyl, substituted or unsubstituted $C_{7-20}$ fluoroarylalkyl, substituted or unsubstituted $C_{5-30}$ heteroarylalkyl, or substituted or unsubstituted $C_{5-30}$ fluoroheteroarylalkyl, wherein each $R^{aa}$ is either separate or connected to another group $R^{aa}$ via a single bond or a divalent linking group to form a ring. Each $R^{aa}$ optionally may include as part of its structure one or more groups selected from —O—, —C(O)—, —C(O)—O—, —$C_{1-12}$ hydrocarbylene-, —O—($C_{1-12}$ hydrocarbylene)-, —C(O)—O—($C_{1-12}$ hydrocarbylene)-, and —C(O)—O—($C_{1-12}$ hydrocarbylene)-O—. Each $R^{aa}$ independently may optionally comprise an acid-labile group chosen, for example, from tertiary alkyl ester groups, secondary or tertiary aryl ester groups, secondary or tertiary ester groups having a combination of alkyl and aryl groups, tertiary alkoxy groups, acetal groups, or ketal groups. Suitable divalent linking groups for connection of $R^{aa}$ groups include, for example, —O—, —S—, —Te—, —Se—, —C(O)—, —C(S)—, —C(Te)—, —S(O)—, —S(O)$_2$—, —N(R)— or —C(Se)—, substituted or unsubstituted $C_{1-5}$ alkylene, and combinations thereof, wherein R is hydrogen, $C_{1-20}$ alkyl, $C_{1-20}$ heteroalkyl, $C_{6-30}$ aryl, or $C_{4-30}$ heteroaryl, each of which except for hydrogen can be substituted or unsubstituted.

In formula (8), when X is I, p is 2, and $R^1$ is a lone pair of electrons. In formula (8), when X is S, p is 3, and $R^1$ is a substituted or unsubstituted $C_{6-20}$ aryl group In formulae (6), (7), and (8), q and r are each independently an integer from 0 to 5. In formulae (6), (7), and (8), s and t are each independently an integer from 0 to 4.

In formulae (6), (7), and (8), one of $R^h$, $R^i$, $R^j$, and $R^k$ may optionally further comprise an acid-cleavable group as described herein.

Exemplary sulfonium cations include the following:

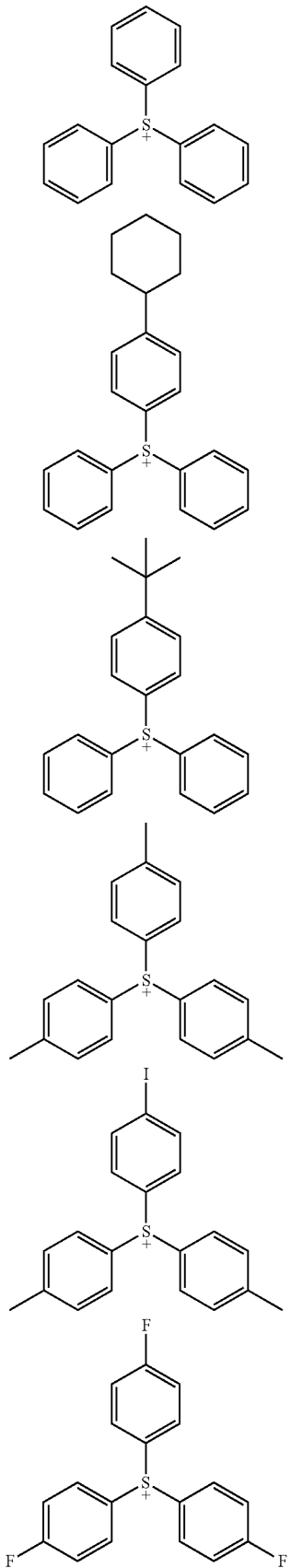

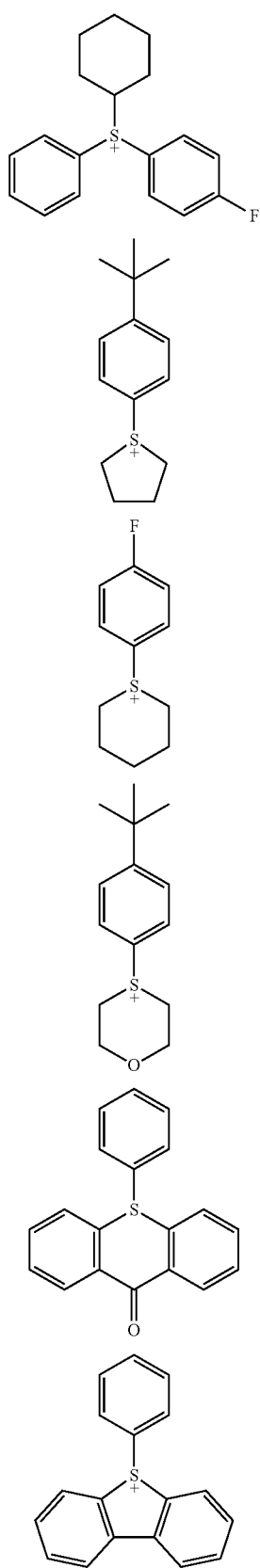
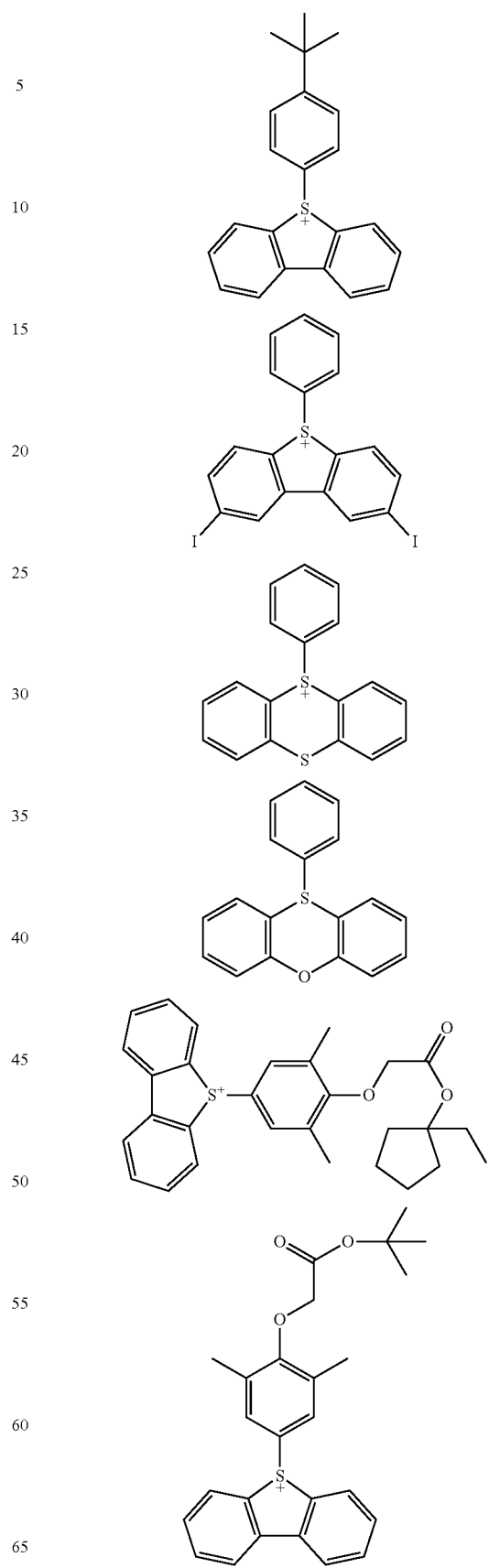

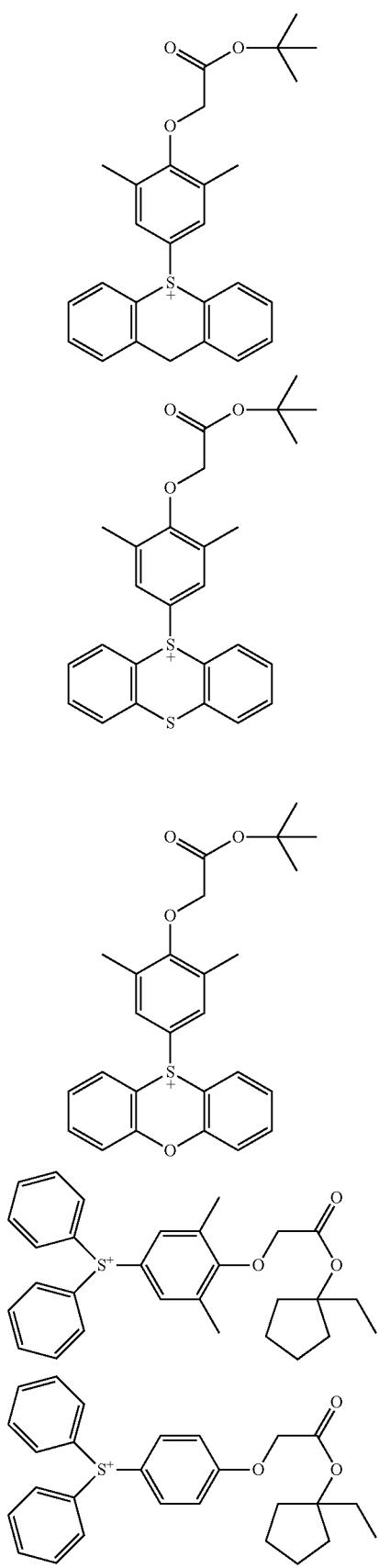
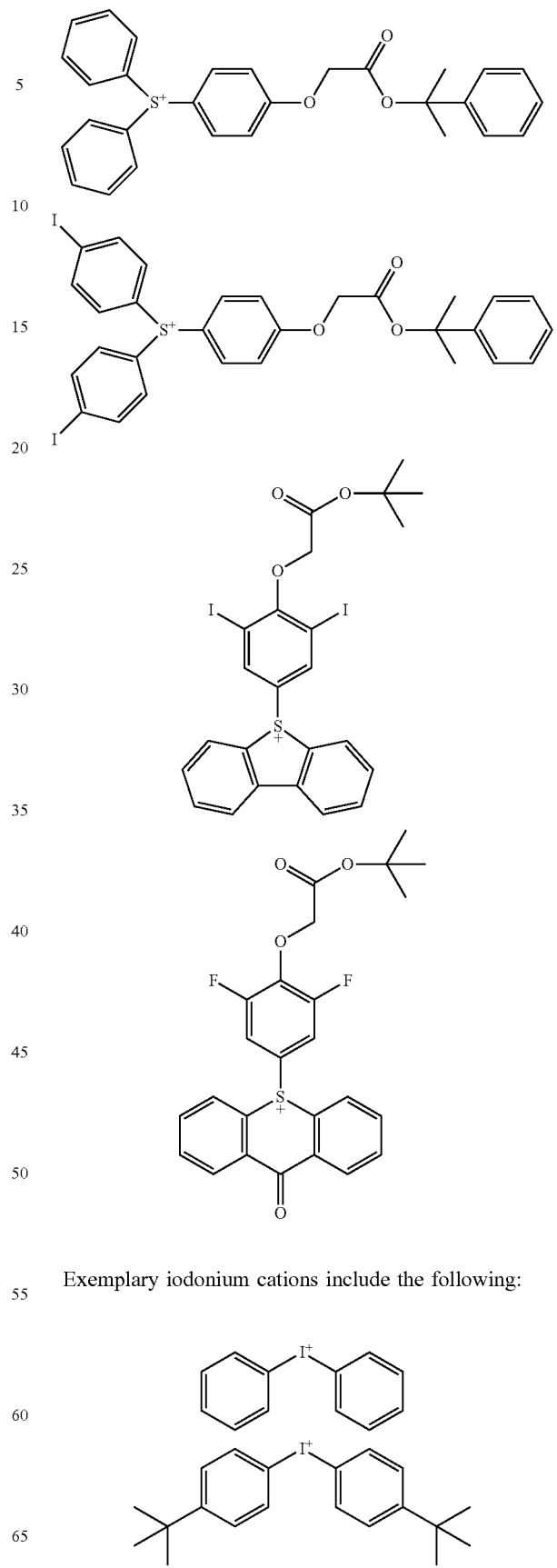
Exemplary iodonium cations include the following:
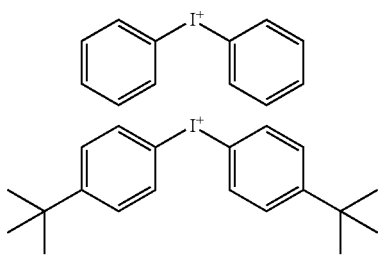

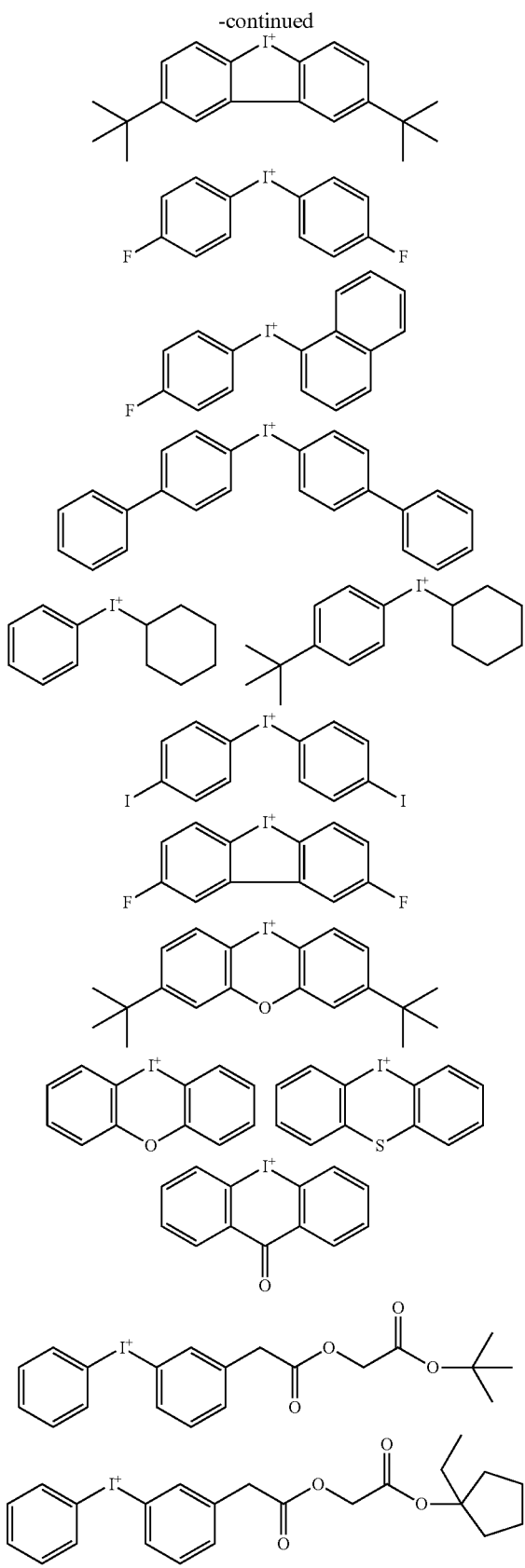

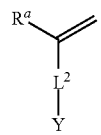

(9)

In formula (9), $R^a$ is hydrogen, halogen, cyano, substituted or unsubstituted $C_{1-10}$ alkyl, or substituted or unsubstituted $C_{1-10}$ fluoroalkyl. Preferably, $R^a$ is hydrogen, fluorine, or substituted or unsubstituted $C_{1-5}$ alkyl, typically methyl.

In formula (9), $L^2$ is a single bond or a divalent linking group. Typically, $L^2$ is a single bond or a divalent linking group comprising one or more of substituted or unsubstituted $C_{1-30}$ alkylene, substituted or unsubstituted $C_{3-30}$ cycloalkylene, substituted or unsubstituted $C_{1-30}$ heterocycloalkylene, substituted or unsubstituted $C_{6-30}$ arylene, substituted or unsubstituted divalent $C_{7-30}$ arylalkyl, substituted or unsubstituted $C_{1-30}$ heteroarylene, substituted or unsubstituted divalent $C_{3-30}$ heteroarylalkyl, —O—, —C(O)—, —NH—, —S(O)$_2$—, or —S(O)—. Preferably, $L^2$ is a single bond, or substituted or unsubstituted $C_{1-30}$ alkylene.

In formula (9), Y comprises a hydroxy-substituted $C_{1-30}$ alkyl group, a hydroxy-substituted $C_{3-30}$ cycloalkyl group, a hydroxy-substituted $C_{6-30}$ aryl group, a hydroxy-substituted $C_{5-30}$ heteroaryl group, or a combination thereof, each of which is optionally further substituted. For example, each may be further substituted (i.e., to include a further substituent group in addition to the hydroxy moiety) with one or more of substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{1-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, or substituted or unsubstituted $C_{4-30}$ heteroarylalkyl, —OR$^{9a}$, or —NR$^{9b}$R$^{9c}$, wherein R$^{9a}$ to R$^{9c}$ are each independently substituted or unsubstituted $C_{1-30}$ alkyl, substituted or unsubstituted $C_{3-30}$ cycloalkyl, substituted or unsubstituted $C_{2-30}$ heterocycloalkyl, substituted or unsubstituted $C_{6-30}$ aryl, substituted or unsubstituted $C_{7-30}$ arylalkyl, substituted or unsubstituted $C_{3-30}$ heteroaryl, or substituted or unsubstituted $C_{4-30}$ heteroarylalkyl.

Exemplary monomers of formula (9) include the following:

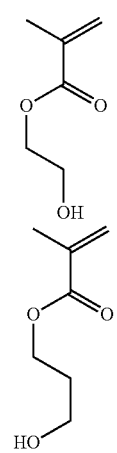

The second repeating unit of the second polymer preferably may be derived from a monomer of formula (9):

-continued
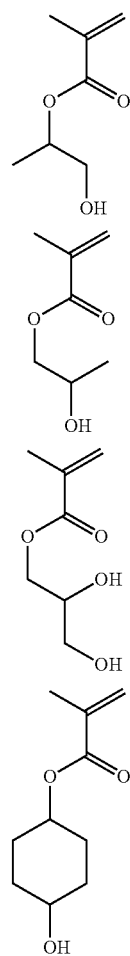
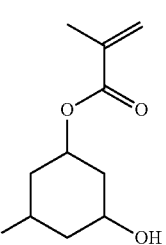
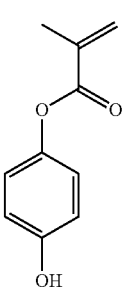
-continued
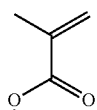
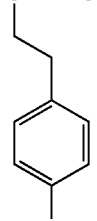
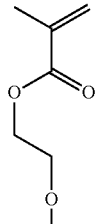
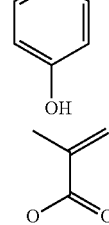
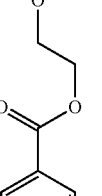
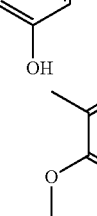
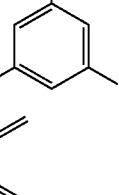
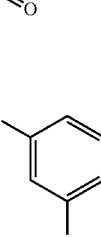

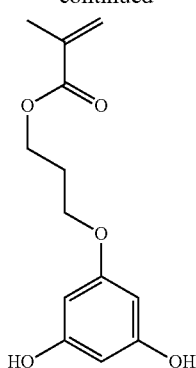

In some embodiments, the second polymer may optionally include a third repeating unit comprising an unsubstituted $C_{1-30}$ alkyl group, a fluorine-substituted $C_{1-30}$ alkyl group, a $C_{1-30}$ alkyl group substituted with a polymerizable group, a $C_{3-30}$ cycloalkyl group substituted with a polymerizable group, or a $C_{6-30}$ aryl group substituted with a polymerizable group, wherein the polymerizable group is reactive to self-crosslink the second polymer. The third repeating unit may be selected to improve solubility, hydrophobicity, and/or the ability to self-crosslink.

Exemplary monomers that may be suitable to prepare the third repeating unit include the following:

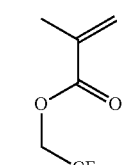

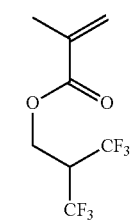

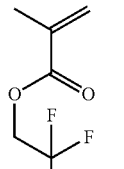

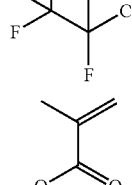

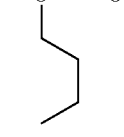

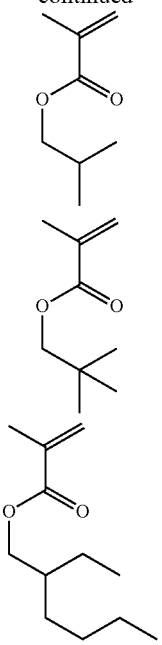

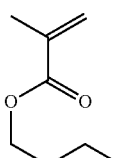

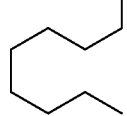

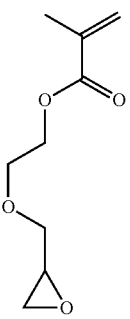

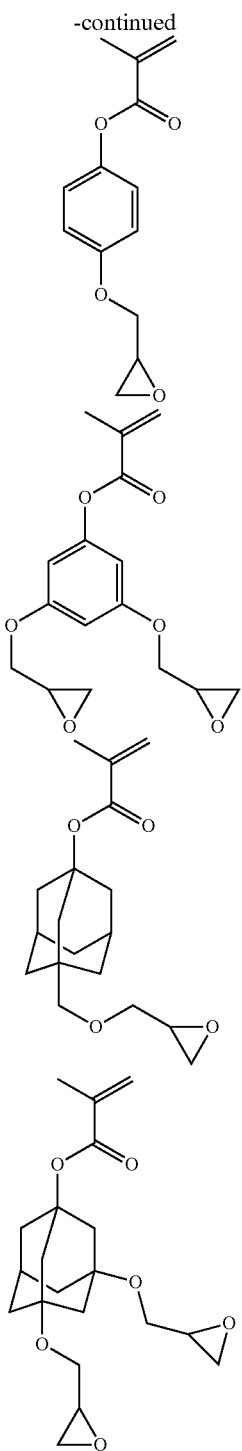

In an embodiment, the polymerizable group of the second polymer comprises carboxyl, thiol, amino, epoxy, alkoxy, amido, vinyl, or a combination thereof.

The second polymer may optionally include one or more additional repeating unit(s) different from the first, second, and third repeating units described herein. The additional repeating units may include, for example, one or more additional units for purposes of adjusting properties of the photoresist composition, such as etch rate and solubility. Exemplary additional units may include one or more of (meth)acrylate, vinyl ether, vinyl ketone, and vinyl ester.

The one or more additional repeating units if present in the second polymer are typically used in an amount of up to 99 mol %, and typically from 3 to 80 mol %, based on total repeating units of the second polymer.

The second polymer typically has a $M_w$ from 1,000 to 100,000 Da, preferably from 2,000 to 50,000 Da, more preferably 3,000 to 40,000 Da, and still more preferably from 3,000 to 30,000 Da. The PDI of the polymer is typically from 1.1 to 4, and more typically from 1.1 to 3. Molecular weights are determined by GPC using polystyrene standards.

The second polymer may be prepared using any suitable methods in the art. For example, one or more monomers corresponding to the repeating units described herein may be combined, or fed separately, using suitable solvent(s) and initiator, and polymerized in a reactor. For example, the second polymer may be obtained by polymerization of the respective monomers under any suitable conditions, such as by heating at an effective temperature, irradiation with actinic radiation at an effective wavelength, or a combination thereof.

The photoresist underlayer composition may further include any suitable solvent or mixtures of solvents. Suitable solvents include, for example, one or more oxyisobutyric acid esters, particularly methyl-2-hydroxyisobutyrate, 2-hydroxyisobutyric acid, ethyl lactate or one or more of the glycol ethers such as 2-methoxyethyl ether (diglyme), ethylene glycol monomethyl ether, and propylene glycol monomethyl ether; solvents that have both ether and hydroxy moieties such as methoxy butanol, ethoxy butanol, methoxy propanol, and ethoxy propanol; methyl 2-hydroxyisobutyrate; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyro lactone.

The concentration of the dry components in the solvent will depend on several factors such as the method of application. In general, the total solids content of the photoresist underlayer composition may be from 0.05 to 20 wt % of the total weight of the photoresist underlayer composition, preferably the total solids content of the photoresist underlayer composition may be from 0.1 to 5 wt % of the photoresist underlayer composition.

In a preferred embodiment, the photoresist underlayer composition includes 20 to 95 wt % of the first polymer and 5 to 80 wt % of the second polymer, each based on total weight of the first polymer and the second polymer combined. For example, the underlayer composition may include 30 to 90 wt % of the first polymer and 10 to 70 wt % of the second polymer, each based on total weight of the first polymer and the second polymer combined.

The photoresist underlayer composition further includes an acid catalyst. Acid catalysts useful in the present invention include free acids and acid generators. Any free acid which is compatible with the compositions of the present invention and catalyzes crosslinking of the crosslinkable polymer and the crosslinker is suitable for use in the present invention. Examples of free acids include, but are not limited to, sulfonic acids such as methane sulfonic acid, ethane sulfonic acid, propyl sulfonic acid, phenyl sulfonic acid, toluene sulfonic acid, dodecylbenzene sulfonic acid, and trifluoromethyl sulfonic acid. The photoresist underlayer composition may include a one catalyst or may include two or more different acid catalysts.

The acid catalyst may be a thermal acid generator (TAG), which is a compound that can generate an acidic moiety when heated. The thermal acid generator can be nonionic or ionic. Suitable nonionic thermal acid generators include, for example, cyclohexyl p-toluenesulfonate, methyl p-toluenesulfonate, cyclohexyl 2,4,6-triisopropylbenzene sulfonate, nitrobenzyl esters, benzoin tosylate, 2-nitrobenzyl tosylate, tris(2,3-dibromopropyl)-1,3,5-triazine-2,4,6-trione, alkyl esters of organic sulfonic acids, p-toluenesulfonic acid, dodecylbenzenesulfonic acid, oxalic acid, phthalic acid, phosphoric acid, camphorsulfonic acid, 2,4,6-trimethylbenzene sulfonic acid, triisopropylnaphthalene sulfonic acid, 5-nitro-o-toluene sulfonic acid, 5-sulfosalicylic acid, 2,5-dimethylbenzene sulfonic acid, 2-nitrobenzene sulfonic acid, 3-chlorobenzene sulfonic acid, 3-bromobenzene sulfonic acid, 2-fluorocaprylnaphthalene sulfonic acid, dodecylbenzene sulfonic acid, 1-naphthol-5-sulfonic acid, 2-methoxy-4-hydroxy-5-benzoyl-benzene sulfonic acid, and their salts, and combinations thereof. Suitable ionic thermal acid generators include, for example, dodecylbenzenesulfonic acid triethylamine salts, dodecylbenzenedisulfonic acid triethylamine salts, p-toluene sulfonic acid-ammonium salts, sulfonate salts, such as carbocyclic aryl (e.g. phenyl, napthyl, anthracenyl, etc.) and heteroaryl (e.g. thienyl) sulfonate salts, aliphatic sulfonate salts and benzenesulfonate salts. Compounds that generate a sulfonic acid upon activation are generally suitable. Preferred thermal acid generators include p-toluenesulfonic acid ammonium salts and fluorinated derivatives thereof. In an embodiment, the acid catalyst comprises N-benzyl-N,N-dimethylammonium trifluoromethanesulfonate. Typically, one or more thermal acid generators may be present in the photoresist underlayer composition in an amount from 0.1 to 20 wt %, more preferably 0.5 to 15 wt % of the solids content of the photoresist underlayer composition.

Preferably, the acid catalyst is not an additional PAG compound. It is to be understood that the term "an additional PAG compound" refers to a PAG-containing polymeric or non-polymeric material that is different from the second polymer of the photoresist underlayer composition as described herein.

The photoresist underlayer composition may further include one or more additives chosen from crosslinking agents and surfactants. It will be appreciated by those skilled in the art that other additives may suitably be used in the present compositions. In some aspects, the photoresist underlayer composition does not include a crosslinking agent, a surfactant, or both a crosslinking agent and a surfactant.

For example, the photoresist underlayer composition may further include a crosslinking agent. Any suitable crosslinking agent may be used in the present compositions, provided that such crosslinking agent has at least 2, and preferably at least 3, moieties capable of reacting with the present polymer under suitable conditions, such as under acidic conditions. Exemplary crosslinking agents include, but are not limited to, novolac resins, epoxy-containing compounds, melamine compounds, guanamine compounds, isocyanate-containing compounds, benzocyclobutenes, benzoxazines, and the like, and typically any of the foregoing having 2 or more, more typically 3 or more substituents selected from methylol, $C_{1-10}$ alkoxymethyl, and $C_{2-10}$ acyloxymethyl. Examples of suitable crosslinking agents are those shown by formulae (10) and (11).

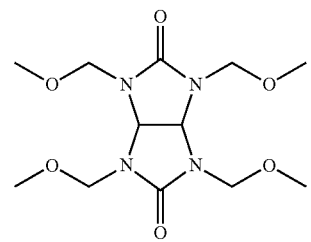

(10)

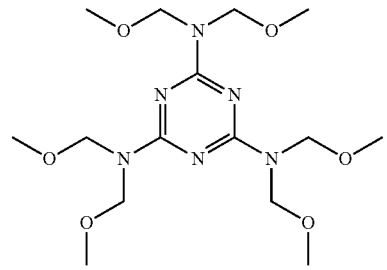

(11)

Such crosslinking agents are well-known in the art and are commercially available from a variety of sources. The amount of such crosslinking agents useful in the present compositions may be, for example, in the range of from greater than 0 to 50 wt %, and typically from greater than 0 to 30 wt % based on total solids of the photoresist underlayer composition.

The present photoresist underlayer composition may optionally include one or more surface leveling agents (or surfactants). Typical surfactants include those which exhibit an amphiphilic nature, meaning that they may be both hydrophilic and hydrophobic at the same time. Amphiphilic surfactants possess a hydrophilic head group or groups, which have a strong affinity for water and a long hydrophobic tail, which is organophilic and repels water. Suitable surfactants may be ionic (i.e., anionic, cationic) or nonionic. Further examples of surfactants include silicone surfactants, poly(alkylene oxide) surfactants, and fluorochemical surfactants. Suitable non-ionic surfactants include, but are not limited to, octyl and nonyl phenol ethoxylates such as TRITON X-114, X-100, X-45, X-15 and branched secondary alcohol ethoxylates such as TERGITOL TMN-6 (The Dow Chemical Company, Midland, Michigan USA) and PF-656 (Omnova Solutions, Beachwood, Ohio, USA). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in *McCutcheon's Emulsifiers and Detergents*, North American Edition for the Year 2000 published by Manufacturers Confectioners Publishing Co. of Glen Rock, N.J. Nonionic surfactants that are acetylenic diol derivatives also may be suitable. Such surfactants are commercially available from Air Products and Chemicals, Inc. of Allentown, PA and sold under the trade names of SURFYNOL and DYNOL. Additional suitable surfactants include other polymeric compounds such as the tri-block EO-PO-EO co-polymers PLURONIC 25R2, L121, L123, L31, L81, L101, and P123 (BASF, Inc.). Such surfactants if used may be present in the composition in minor amounts, for example from greater than 0 to 1 wt % based on total solids of the photoresist underlayer composition.

Another aspect of the present invention provides a coated substrate, including a cured layered of the photoresist underlayer composition disposed on a substrate; and a photoresist layer disposed on the layer of the photoresist underlayer composition. As used herein, the term "cured layer" refers to a layer derived from the photoresist underlayer composition after the composition has been disposed on a substrate and subsequently cured to form a coating layer or film. In other words, curing the photoresist underlayer composition forms a cured layer derived from the photoresist underlayer composition.

Still another aspect of the present invention provides a method of forming a pattern. The method includes: applying a layer of the inventive photoresist underlayer composition on a substrate; curing the layer of the photoresist underlayer composition to form an underlayer film; applying a layer of a photoresist composition on the underlayer film to form a photoresist layer; pattern-wise exposing the photoresist layer to activating radiation; and developing the exposed photoresist layer to provide a resist relief image.

A wide variety of substrates may be used in the patterning methods, with electronic device substrates being typical. Suitable substrates include, for example, packaging substrates such as multichip modules; flat panel display substrates; integrated circuit substrates; substrates for light emitting diodes (LEDs) including organic light emitting diodes (OLEDs); semiconductor wafers; polycrystalline silicon substrates; and the like. Suitable substrates may be in the form of wafers such as those used in the manufacture of integrated circuits, optical sensors, flat panel displays, integrated optical circuits, and LEDs. As used herein, the term "semiconductor wafer" is intended to encompass "an electronic device substrate," "a semiconductor substrate," "a semiconductor device," and various packages for various levels of interconnection, including a single-chip wafer, multiple-chip wafer, packages for various levels, or other assemblies requiring solder connections. Such substrates may be any suitable size. Typical wafer substrate diameters are 200 mm to 300 mm, although wafers having smaller and larger diameters may be suitably employed according to the present invention. As used herein, the term "semiconductor substrate" includes any substrate having one or more semiconductor layers or structures which may optionally include active or operable portions of semiconductor devices. A semiconductor device refers to a semiconductor substrate upon which at least one microelectronic device has been or is being batch fabricated.

The substrates are typically composed of one or more of silicon, polysilicon, silicon oxide, silicon nitride, silicon oxynitride, silicon germanium, gallium arsenide, aluminum, sapphire, tungsten, titanium, titanium-tungsten, nickel, copper, and gold. The substrate may include one or more layers and patterned features. The layers may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers, such as single-crystal silicon, and combinations thereof. The layers can be formed by various techniques, for example, chemical vapor deposition (CVD) such as plasma-enhanced CVD (PECVD), low-pressure CVD (LPCVD) or epitaxial growth, physical vapor deposition (PVD) such as sputtering or evaporation, or electroplating.

It may be desired in certain patterning methods of the invention to provide one or more lithographic layers such as a hardmask layer, for example, a spin-on-carbon (SOC), amorphous carbon, or metal hardmask layer, a CVD layer such as a silicon nitride (SiN) layer, silicon oxide (SiO) layer, or silicon oxynitride (SiON) layer, an organic or inorganic BARC layer, or a combination thereof, on an upper surface of the substrate prior to forming the photoresist underlayer of the invention. Such layers, together with an overcoated underlayer of the invention and photoresist layer, form a lithographic material stack. Typical lithographic stacks which may be used in the patterning methods of the invention include, for example, the following: SOC layer/underlayer/photoresist layer; SOC layer/SiON layer/underlayer/photoresist layer; SOC layer/SiARC layer/underlayer/photoresist layer; SOC layer/metal hardmask layer/underlayer/photoresist layer; amorphous carbon layer/underlayer/photoresist layer; and amorphous carbon layer/SiON layer/underlayer/photoresist layer.

The photoresist underlayer composition may be coated on the substrate by any suitable means, such as spin-coating, slot-die coating, doctor blading, curtain-coating, roller-coating, spray-coating, dip-coating, and the like. In the case of a semiconductor wafer, spin-coating is preferred. In a typical spin-coating method, the photoresist underlayer compositions are applied to a substrate which is spinning at a rate of 500 to 4000 rpm for a period of 15 to 90 seconds to obtain a desired layer of the photoresist underlayer composition on the substrate. It will be appreciated by those skilled in the art that the thickness of the coated photoresist underlayer composition may be adjusted by changing the spin speed, as well as the solids content of the photoresist underlayer composition. A photoresist underlayer formed from the photoresist underlayer composition typically has a dried layer thickness of from 1 to 50 nm, more typically from 1 to 20 nm.

The applied photoresist underlayer composition is optionally softbaked at a relatively low temperature to remove any solvent and other relatively volatile components from the photoresist underlayer composition. Typically, the coated substrate is baked at a temperature of less than or equal to 150° C., preferably from 60 to 130° C., and more preferably from 90 to 120° C. The baking time is typically from 10 seconds to 10 minutes, preferably from 30 seconds to 5 minutes, and more preferably from 6 to 120 seconds. When the substrate is a wafer, such baking steps may be performed by heating the wafer on a hot plate. The soft-baking step may be performed as part of the curing of the applied photoresist underlayer composition or may be omitted altogether.

The applied photoresist underlayer composition is then cured to form a photoresist underlayer. The applied photoresist underlayer composition should be sufficiently cured such that the resulting underlayer does not intermix, or minimally intermixes, with a subsequently applied layer, such as a photoresist or other organic or inorganic layer disposed directly on the photoresist underlayer. The applied photoresist underlayer composition may be cured in an oxygen-containing atmosphere, such as air, or in an inert atmosphere, such as nitrogen and under conditions, such as heating, sufficient to provide a cured coating layer. This curing step is preferably conducted on a hot plate-style apparatus, although oven curing may be used to obtain equivalent results. The curing temperature should be sufficient for the acid catalyst to effect curing throughout the layer, for example, sufficient to allow a free acid to effect crosslinking, or to allow a thermal acid generator to liberate acid and the liberated acid to effect crosslinking. Typically, the curing is conducted at a temperature of 150° C. or greater, and preferably 150 to 450° C. It is more preferred that the curing temperature is 180° C. or greater, still more preferably 200° C. or greater, and even more preferably from 200 to 400° C. The curing time is typically from 10 seconds to 10 minutes, preferably from 30 seconds to 5 minutes, more preferably from 45 seconds to 2 minutes, and still more preferably from 45 to 90 seconds. Optionally, a ramped or a multi-stage curing process may be used. A ramped bake typically begins at a relatively low (e.g., ambient) temperature that is increased at a constant or varied ramp rate to a higher target temperature. A multi-stage curing process involves curing at two or more temperature plateaus, typically a first stage at a lower bake temperature and one or more additional stages at a higher temperature. Conditions for such ramped or multi-stage curing processes are known to those skilled in the art and may allow for omission of a preceding softbake process.

After curing of the applied photoresist underlayer composition, one or more processing layers, such as a photoresist layer, a hardmask layer such as a metal hardmask layer, an organic or inorganic BARC layer, and the like, may be disposed over the cured photoresist underlayer. A photoresist layer may be formed directly on the surface of the photoresist underlayer or, alternatively, may be formed above the photoresist underlayer on one or more intervening layers. In this case, one or more intervening processing layers such as described above can be sequentially formed over the photoresist underlayer followed by formation of the photoresist layer. Determination of suitable layers, thicknesses and coating methods are well known to those skilled in the art.

A wide variety of photoresists may be suitably used in the methods of the invention and are typically positive-tone materials. Suitable photoresists include, for example, materials within the EPIC series of photoresists available from DuPont Electronics & Imaging (Marlborough, Massachusetts). The photoresist can be applied to the substrate by known coating techniques such as described above with reference to the photoresist underlayer composition, with spin-coating being typical. A typical thickness for the photoresist layer is from 10 to 300 nm. The photoresist layer is typically next softbaked to minimize the solvent content in the layer, thereby forming a tack-free coating and improving adhesion of the layer to the substrate. The softbake can be conducted on a hotplate or in an oven, with a hotplate being typical. Typical softbakes are conducted at a temperature of from 70 to 150° C., and a time of from 30 to 90 seconds.

The photoresist layer is next exposed to activating radiation through a photomask to create a difference in solubility between exposed and unexposed regions. References herein to exposing a photoresist composition to radiation that is activating for the composition indicates that the radiation can form a latent image in the photoresist composition. The photomask has optically transparent and optically opaque regions corresponding to regions of the resist layer to be exposed and unexposed, respectively, by the activating radiation. The exposure wavelength is typically sub-400 nm, and more typically, sub-300 nm, such as 248 nm (KrF), 193 nm (ArF), or an EUV wavelength (e.g., 13.5 nm). In a preferred aspect, the exposure wavelength is 193 nm or an EUV wavelength. The exposure energy is typically from 10 to 150 mJ/cm$^2$, depending, for example, on the exposure tool and the components of the photosensitive composition.

Following exposure of the photoresist layer, a post-exposure bake (PEB) is typically performed. The PEB can be conducted, for example, on a hotplate or in an oven. The PEB is typically conducted at a temperature of from 70 to 150° C., and a time of from 30 to 90 seconds. A latent image defined by the boundary between polarity-switched and unswitched regions (corresponding to exposed and unexposed regions, respectively) is thereby formed. The exposed photoresist layer is then developed using the appropriate developer to provide a patterned photoresist layer.

The pattern of the photoresist layer can then be transferred to one or more underlying layers including the photoresist underlayer and to the substrate by appropriate etching techniques, such as by plasma etching using appropriate gas species for each layer being etched. Depending on the number of layers and materials involved, pattern transfer may involve multiple etching steps using different etching gases. The patterned photoresist layer, photoresist underlayer, and other optional layers in the lithographic stack may be removed following pattern transfer of the substrate using conventional techniques. Optionally, one or more of the layers of the stack may be removed, or is consumed, following pattern transfer to an underlying layer and prior to pattern transfer to the substrate. The substrate is then further processed according to known processes to form an electronic device.

Photoresist underlayers formed from the inventive photoresist underlayer compositions show excellent photospeed and improved pattern collapse. Preferred photoresist underlayer compositions of the invention may, as a result, be useful in a variety of semiconductor manufacturing processes The present inventive concept is further illustrated by the following examples, which are intended to be non-limiting. All compounds and reagents used herein are available commercially except where a procedure is provided below.

EXAMPLES

Polymer Synthesis

Synthesis Example 1

To a round bottom flask were added 30.4 grams (g) of Tris(2-hydroxyethyl)iso-cyanurate, 20.1 g of tris(2-carboxyethyl)iso-cyanurate, 0.5 g of p-toluenesulfonic acid, 20 g of n-butanol, and 34 g of anisole. The reaction mixture was heated to 150° C. and stirred for 3 hours (hrs.), and then diluted with 2-hydroxyisobutyric acid methyl ester (160 g) to form a mixed solution. A mixture containing 3.6 g of 1,3,4,6-tetrakis(methoxymethyl)tetrahydroimidazo[4,5-d]imidazole-2,5(1H,3H)-dione and 0.1 g of p-toluenesulfonic acid were subsequently added to 40 g of the mixed solution, and the contents were heated to 50° C. with stirring for 4 hrs. The reaction mixture was cooled to room temperature and quenched with the addition of triethylamine (0.4 mL). The product was precipitated from isopropyl alcohol and heptane, filtered, and then dried at 40° C. for 16 hrs.

The structure for the polymer of Synthesis Example 1 is represented by formula (I):

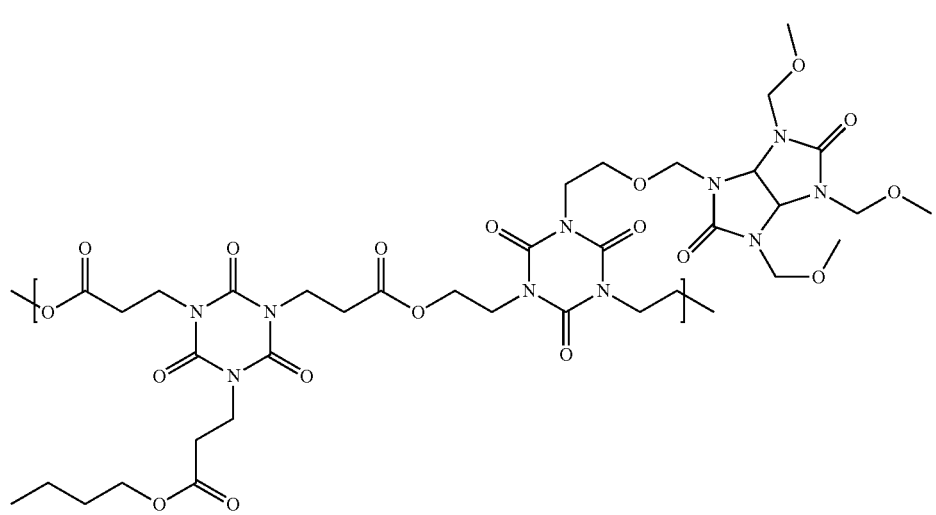

(I)

Synthesis Example 2

To a first round bottom flask were added 34.3 g of a solution containing ethyl lactate and gamma-butyrolactone (1:1 by weight) and the contents were heated to 80° C. In a second round bottom flask, 13.9 g of (4-(tert-butyl)phenyl)diphenylsulfonium 1,1-difluoro-2-(methacryloyloxy)ethane-1-sulfonate, 3.3 g of 2-hydroxyethyl methacrylate, 12.8 g of 2,2,2-trifluoroethyl methacrylate, and 1.2 g of V601 initiator were dissolved in 150 g of a solution containing ethyl lactate and gamma-butyrolactone (1:1 by weight) and this mixture was transferred into the first round bottom flask over 4 hrs. After the transfer was completed, the reaction mixture was maintained at 80° C. for additional 1 hr., and then the contents were allowed to cool to room temperature. The product was precipitated from methyl tert-butyl ether, filtrated, and then dried at 40° C. for 16 hrs.

The structure for the polymer of Synthesis Example 2 is represented by formula (II), wherein a is 19, b is 22, and c is 59.

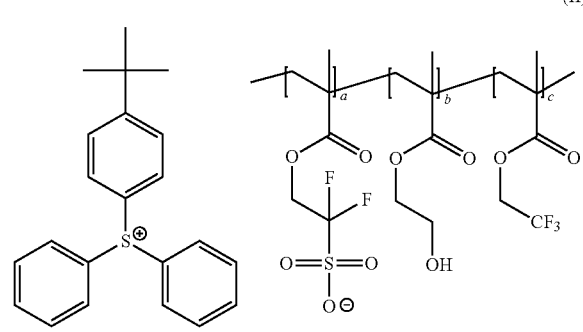

(II)

Synthesis Example 3

To a first round bottom flask were added 45.7 g of ethyl lactate and gamma-butyrolactone (1:1 by weight) and the contents were heated to 80° C. In a second round bottom flask, 15.2 g of 5-(4-(tert-butyl)phenyl)-5H-dibenzo[b,d]thiophen-5-ium 1,1-difluoro-2-(methacryloyloxy)ethane-1-sulfonate, 6.0 g of 2-hydroxyethyl methacrylate, 18.7 g of 2,2,2-trifluoroethyl methacrylate, and 1.7 g of V601 initiator were dissolved in 200 g of a solution containing ethyl lactate and gamma-butyrolactone (1:1 by weight) and this mixture was transferred into the first round bottom flask over 4 hrs. After the transfer was completed, the reaction mixture was maintained at 80° C. for additional 1 hr., and then the contents were allowed to cool to room temperature. The product was precipitated from methyl tert-butyl ether, filtrated, and then dried at 40° C. for 16 hrs.

The structure for the polymer of Synthesis Example 3 is represented by formula (II) above, wherein a is 17, b is 25, and c is 58.

Synthesis Example 4

To a first round bottom flask were added 14.4 g of bis(4-(tert-butyl)phenyl)iodonium 1,1-difluoro-2-(methacryloyloxy)ethane-1-sulfonate, 5.0 g of 2-hydroxyethyl methacrylate, 15.6 g of 2,2,2-trifluoroethyl methacrylate and 1.4 g of V601 initiator were dissolved in 175 g of a solution containing ethyl lactate and gamma-butyrolactone (1:1 by weight) and this mixture was transferred into the first round bottom flask over 4 hrs. After the transfer was completed, the reaction mixture was maintained at 80° C. for additional 1 hr., and then the contents were allowed to cool to room temperature. The product was precipitated from methyl tert-butyl ether, filtrated, and then dried at 40° C. for 16 hrs.

The structure for the polymer of Synthesis Example 4 is represented by formula (II) above, wherein a is 17, b is 25, and c is 58.

Synthesis Example 5

To a first round bottom flask were added 2.3 g of 5-(4-(2-((1-ethylcyclopentyl)oxy)-2-oxoethoxy)-3,5-dimethylphenyl)-5H-dibenzo[b,d]thiophen-5-ium ((trifluoromethyl)sulfonyl)((4-vinylphenyl)sulfonyl)amide, 0.7 g of 2-hydroxyethyl methacrylate, 2.0 g of 2,2,2-trifluoroethyl methacrylate, and 0.2 g of V601 initiator were dissolved in 25 g of a solution containing ethyl lactate and gamma-butyrolactone (1:1 by weight) and this mixture was transferred into the first round bottom flask over 4 hrs. After the transfer was completed, the reaction mixture was maintained at 80° C. for additional 1 hr., and then the contents were allowed to cool to room temperature. The product was precipitated from methyl tert-butyl ether, filtrated, and then dried at 40° C. for 16 hrs.

The structure for the polymer of Synthesis Example 5 is represented by formula (III), wherein a is 19, b is 26, and c is 55.

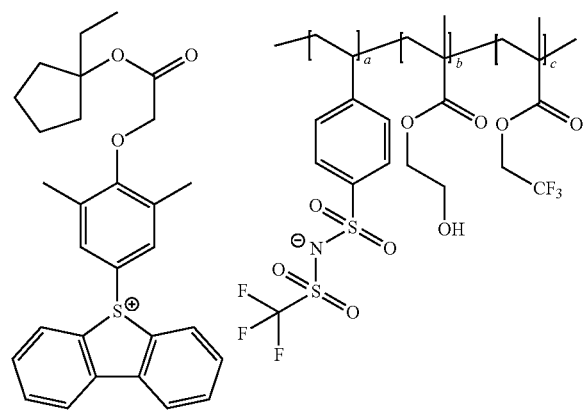

(III)

Compositions

Example 1

0.23 g of the polymer of Synthesis Example 1, 0.06 g of the polymer of Synthesis Example 2, and 0.01 g of 2,4,6-trimethylpyridin-1-ium 4-methylbenzenesulfonate were dissolved in 99.7 g of methyl 2-hydroxyisobutyrate. The mixture was passed through a micro syringe filter with a pore size of 0.2 microns.

Example 2

0.23 g of the polymer of Synthesis Example 1, 0.06 g of the polymer of Synthesis Example 3, and 0.01 g of 2,4,6-trimethylpyridin-1-ium 4-methylbenzenesulfonate were dissolved in 99.7 g of methyl 2-hydroxyisobutyrate. The mixture was passed through a micro syringe filter with a pore size of 0.2 microns.

Example 3

0.22 g of the polymer of Synthesis Example 1, 0.07 g of the polymer of Synthesis Example 3, and 0.01 g of 2,4,6-trimethylpyridin-1-ium 4-methylbenzenesulfonate were dissolved in 99.7 g of methyl 2-hydroxyisobutyrate. The mixture was passed through a micro syringe filter with a pore size of 0.2 microns.

Example 4

0.23 g of the polymer of Synthesis Example 1, 0.06 g of the polymer of Synthesis Example 4, and 0.01 g of 2,4,6-trimethylpyridin-1-ium 4-methylbenzenesulfonate were dissolved in 99.7 g of methyl 2-hydroxyisobutyrate. The mixture was passed through a micro syringe filter with a pore size of 0.2 microns.

Example 5

0.23 g of the polymer of Synthesis Example 1, 0.06 g of the polymer of Synthesis Example 5, and 0.01 g of 2,4,6-trimethylpyridin-1-ium 4-methylbenzenesulfonate were dissolved in 99.7 g of methyl 2-hydroxyisobutyrate. The mixture was passed through a micro syringe filter with a pore size of 0.2 microns.

Example 6 (Comparative)

0.29 g of the polymer of Synthesis Example 1, and 0.01 g of 2,4,6-trimethylpyridin-1-ium 4-methylbenzenesulfonate were dissolved in 99.7 g of methyl 2-hydroxyisobutyrate. The mixture was passed through a micro syringe filter with a pore size of 0.2 microns.

Photoresist Composition

The mixture for manufacturing the photoresist composition is prepared by combining the following components. (1r,3r,5r,7r)-2-isopropyladamantan-2-yl methacrylate:1-methylcyclopentyl methacrylate:2-oxotetrahydrofuran-3-yl methacrylate:(3aS,4S,5R,7S,7aS)-1-oxooctahydro-4,7-epoxyisobenzofuran-5-yl methacrylate (26.40 g, 10 wt % in propylene glycol monomethyl ether acetate, molar ratio of units in copolymer is 11:29:42:18), 2-(methacryloyloxy)propane-1,3-diyl bis(2,2-difluoropropanoate):1-ethylcyclopentyl methacrylate (1.96 g, 5 wt % in propylene glycol monomethyl ether acetate, molar ratio of units in copolymer is 96:4), triphenylsulfonium 1,1-difluoro-2-(((1r,3s,5R,7S)-3-hydroxyadamantan-1-yl)methoxy)-2-oxoethane-1-sulfonate (53.78 g, 0.8 wt % in methyl-2-hydroxyisobutyrate), tri-p-tolylsulfonium ((3s,5s,7s)-adamantan-1-yl) sulfamate (8.97 g, 2 wt % in methyl-2-hydroxyisobutyrate), tert-butyl (1,3-dihydroxy-2-(hydroxymethyl)propan-2-yl) carbamate (0.29 g, 2 wt % in methyl-2-hydroxyisobutyrate), propylene glycol monomethyl ether acetate (14.05 g), and methyl-2-hydroxyisobutyrate (0.16 g). The mixture was passed through a filter having a pore size of 0.2 microns. The mixture was then added to a solution of propylene glycol methyl ether acetate and 2-hydroxyisobutyric acid methyl ester (2:3 by weight) to form the photoresist composition having a 1.1 wt % solids content.

Resist Pattern Formation Evaluation

The compositions of Examples 1 to 6 were coated on 8-inch bare silicon wafers and cured at 205° C. for 60 seconds (s) to form a first layer having a thickness of 50 Å. The photoresist composition was then coated over the first layer and the resulting combination was soft-baked at 110° C. for 90 seconds to form a second layer having a thickness of 30 nm. The wafers were exposed on a JBX9300FS EB scanner at an energy of 100 keV to form a 70 nm 1:1 line/space (L/S) pattern. The wafers were post-exposure baked at 100° C. for 60 seconds, developed with a 0.26 N TMAH solution, and spun-dried to form photoresist patterns. The patterned wafers were inspected on a HITACHI S9380 CD-SEM tool. The optimum exposure dose $E_{op}$ ($\mu C/cm^2$) for 70 nm 1:1 L/S patterning resist on underlayer examples were evaluated by direct E-beam writing using E-beam lithography. The results are shown in Table 1.

TABLE 1

| | $E_{op}$ ($\mu C/cm^2$) | Patterning dose (μC) | EL Margin (%) |
|---|---|---|---|
| Example 1 | 386 | 300 | 14.7 |
| Example 2 | 306 | 240 | 17.3 |
| Example 3 | 269 | 200 | 19.0 |

TABLE 1-continued

| | $E_{op}$ (µC/cm²) | Patterning dose (µC) | EL Margin (%) |
|---|---|---|---|
| Example 4 | 298 | 240 | 16.9 |
| Example 5 | 367 | 280 | 15.9 |
| Example 6 (Comparative) | 457 | 320 | 12.8 |

The photoresist underlayer compositions of Examples 1 to 5, which can improve scum/bridge defects by effective acid generation, achieved a 20-41% faster photo-speed, and showed improved pattern collapse margins at low-dose areas relative to comparative Example 6.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A coated substrate, comprising:
    a cured layer of a photoresist underlayer composition disposed on a substrate; and
    a photoresist layer disposed on the cured layer of the photoresist underlayer composition,
    wherein the photoresist underlayer composition is different from the photoresist layer,
    wherein the photoresist underlayer composition comprises:
    a first polymer comprising an isocyanurate repeating unit and a crosslinkable group;
    a second polymer comprising:
        a first repeating unit comprising a repeating unit comprising a photoacid generator, and
        a second repeating unit comprising a hydroxy-substituted $C_{1-30}$ alkyl group, a hydroxy-substituted $C_{3-30}$ cycloalkyl group, or a hydroxy-substituted $C_{6-30}$ aryl group;
    an acid catalyst, wherein the acid catalyst is different from the photoacid generator of the second polymer; and
    a solvent.

2. The coated substrate of claim 1, wherein the isocyanurate repeating unit is derived from a monomer of formula (1):

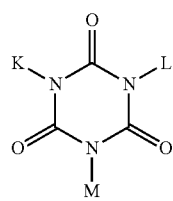

(1)

wherein, in formula (1),
    K, L, and M are each independently a linear or branched $C_{1-10}$ hydrocarbon group, a $C_{1-10}$ alkoxycarbonyl group, a $C_{1-10}$ alkanoyloxy group, each of which is optionally substituted with a carboxylic acid group, or a linear or branched $C_{1-10}$ hydroxyalkyl group optionally substituted with a $C_{1-5}$ alkoxycarbonyl group or a $C_{1-5}$ substituted alkoxy group, and
    wherein at least one hydrogen atom of the first polymer is substituted with a functional group independently chosen from hydroxyl, carboxyl, thiol, amino, epoxy, alkoxy, amido, vinyl, and a combination thereof.

3. The coated substrate of claim 1, wherein the first repeating unit of the second polymer comprises a repeating unit derived from a monomer of formula (2):

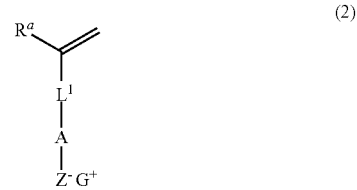

(2)

wherein, in formula (2),
    $R^a$ is hydrogen, fluorine, cyano, a substituted or unsubstituted $C_{1-10}$ alkyl, or a substituted or unsubstituted $C_{1-10}$ fluoroalkyl,
    $L^1$ is a single bond or a divalent linking group,
    A is a divalent linking group;
    $Z^-$ is an anionic moiety comprising sulfonate, an anion of a sulfonamide, an anion of a sulfonimide, or a methide anion; and
    $G^+$ is an organic cation.

4. The coated substrate of claim 3, wherein $-L^1-A-Z^-$ is represented by one of formulae (3) to (5b):

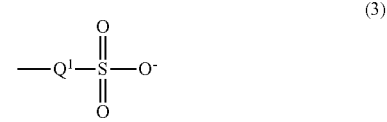

(3)

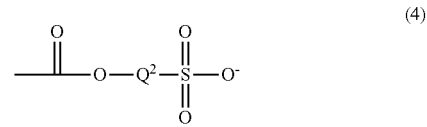

(4)

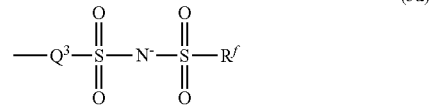

(5a)

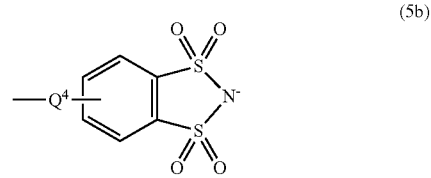

(5b)

wherein, in formulae (3) to (5b),
    $Q^1$ and $Q^2$ are each independently a fluorine-substituted divalent linking group;
    $Q^3$ is a divalent linking group;
    $Q^4$ is a single bond or a divalent linking group; and
    $R^f$ is a fluorine-substituted $C_{1-30}$ alkyl, a fluorine-substituted $C_{3-30}$ cycloalkyl, or a single bond forming a ring with $Q^3$.

5. The coated substrate of claim 3, wherein $G^+$ is a cation represented by one of formulae (6), (7), or (8):

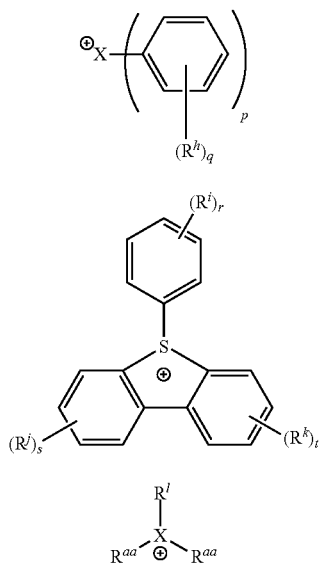

wherein, in formulae (6), (7), and (8):

X is I or S;

$R^h$, $R^i$, $R^j$, and $R^k$ are each independently hydroxy, nitrile, halogen, substituted or unsubstituted $C_{1-30}$ alkyl, substituted or unsubstituted $C_{1-30}$ fluoroalkyl, substituted or unsubstituted $C_{3-30}$ cycloalkyl, substituted or unsubstituted $C_{1-30}$ fluorocycloalkyl, substituted or unsubstituted $C_{1-30}$ alkoxy, substituted or unsubstituted $C_{3-30}$ alkoxycarbonylalkyl, substituted or unsubstituted $C_{3-30}$ alkoxycarbonylalkoxy, substituted or unsubstituted $C_{3-30}$ cycloalkoxy, substituted or unsubstituted $C_{5-30}$ cycloalkoxycarbonylalkyl, substituted or unsubstituted $C_{5-30}$ cycloalkoxycarbonylalkoxy, substituted or unsubstituted $C_{1-30}$ fluoroalkoxy, substituted or unsubstituted $C_{3-30}$ fluoroalkoxycarbonylalkyl, substituted or unsubstituted $C_{3-30}$ fluoroalkoxycarbonylalkoxy, substituted or unsubstituted $C_{3-30}$ fluorocycloalkoxy, substituted or unsubstituted $C_{5-30}$ fluorocycloalkoxycarbonylalkyl, substituted or unsubstituted $C_{5-30}$ fluorocycloalkoxycarbonylalkoxy, substituted or unsubstituted $C_{6-30}$ aryl, $C_{6-30}$ fluoroaryl, substituted or unsubstituted $C_{6-30}$ aryloxy, or substituted or unsubstituted $C_{6-30}$ fluoroaryloxy;

each $R^{aa}$ is independently substituted or unsubstituted $C_{1-20}$ alkyl, substituted or unsubstituted $C_{1-20}$ fluoroalkyl, substituted or unsubstituted $C_{3-20}$ cycloalkyl, substituted or unsubstituted $C_{3-20}$ fluorocycloalkyl, substituted or unsubstituted $C_{2-20}$ alkenyl, substituted or unsubstituted $C_{2-20}$ fluoroalkenyl, substituted or unsubstituted $C_{6-30}$ aryl group, substituted or unsubstituted $C_{6-30}$ fluoroaryl, substituted or unsubstituted $C_{6-30}$ iodoaryl, substituted or unsubstituted $C_{4-30}$ heteroaryl, substituted or unsubstituted $C_{7-20}$ arylalkyl, substituted or unsubstituted $C_{7-20}$ fluoroarylalkyl, substituted or unsubstituted $C_{5-30}$ heteroarylalkyl, or substituted or unsubstituted $C_{5-30}$ fluoroheteroarylalkyl, wherein each $R^{aa}$ is either separate or connected to another group $R^{aa}$ via a single bond or a divalent linking group to form a ring;

when X is I, p is 2, and $R^1$ is a lone pair of electrons;

when X is S, p is 3, and $R^1$ is a substituted or unsubstituted $C_{6-20}$ aryl group;

q and r are each independently an integer from 0 to 5; and s and t are each independently an integer from 0 to 4.

6. The coated substrate of claim 1, wherein the second repeating unit of the second polymer is derived from a monomer of formula (9):

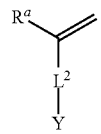

wherein, in formula (9), $R^a$ is hydrogen, halogen, cyano, substituted or unsubstituted $C_{1-10}$ alkyl, or substituted or unsubstituted $C_{1-10}$ fluoroalkyl;

$L^2$ is a single bond or a divalent linking group;

Y comprises a hydroxy-substituted $C_{1-30}$ alkyl group, a hydroxy-substituted $C_{3-30}$ cycloalkyl group, a hydroxy-substituted $C_{6-30}$ aryl group, a hydroxy-substituted $C_{5-30}$ heteroaryl group, or a combination thereof, each of which is optionally further substituted.

7. The coated substrate of claim 1, wherein the crosslinkable group of the first polymer comprises hydroxyl, carboxyl, thiol, amino, epoxy, alkoxy, amido, vinyl, or a combination thereof.

8. The coated substrate of claim 1, wherein the second polymer further comprises a third repeating unit comprising an unsubstituted $C_{1-30}$ alkyl group, a fluorine-substituted $C_{1-30}$ alkyl group, a $C_{1-30}$ alkyl group substituted with a polymerizable group, a $C_{3-30}$ cycloalkyl group substituted with a polymerizable group, or a $C_{6-30}$ aryl group substituted with a polymerizable group, wherein the polymerizable group is reactive to self-crosslink the second polymer.

9. A method of forming a pattern, the method comprising:
applying a layer of the photoresist underlayer composition on the substrate;
curing the applied layer of the photoresist underlayer composition to form an underlayer film;
applying a layer of the photoresist composition on the underlayer film to form the photoresist layer and provide the coated substrate of claim 1;
pattern-wise exposing the applied photoresist layer to activating radiation; and
developing the exposed photoresist layer to provide a resist relief image.

10. The method of claim 9, wherein the first polymer comprises an isocyanurate repeating unit derived from a monomer of formula (1):

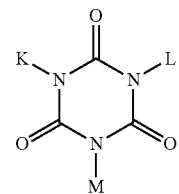

wherein, in formula (1),

K, L, and M are each independently a linear or branched $C_{1-10}$ hydrocarbon group, a $C_{1-10}$ alkoxycarbonyl group, a $C_{1-10}$ alkanoyloxy group, each of which is optionally substituted with a carboxylic acid group, or a linear or branched $C_{1-10}$ hydroxyalkyl group optionally substituted with a $C_{1-5}$ alkoxycarbonyl group or a $C_{1-5}$ substituted alkoxy group, and wherein at least one hydrogen atom of the first polymer is substituted with a functional group independently chosen from hydroxyl, carboxyl, thiol, amino, epoxy, alkoxy, amido, vinyl, and a combination thereof.

11. The method of claim 9, wherein the second repeating unit of the second polymer is derived from a monomer of formula (9):

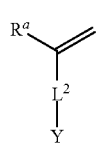

(9)

wherein, in formula (9), $R^a$ is hydrogen, halogen, cyano, substituted or unsubstituted $C_{1-10}$ alkyl, or substituted or unsubstituted $C_{1-10}$ fluoroalkyl;

$L^2$ is a single bond or a divalent linking group;

Y comprises a hydroxy-substituted $C_{1-30}$ alkyl group, a hydroxy-substituted $C_{3-30}$ cycloalkyl group, a hydroxy-substituted $C_{6-30}$ aryl group, a hydroxy-substituted $C_{5-30}$ heteroaryl group, or a combination thereof, each of which is optionally further substituted.

12. The method of claim 9, wherein the first repeating unit of the second polymer comprises a repeating unit derived from a monomer of formula (2):

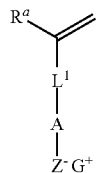

(2)

wherein, in formula (2), $R^a$ is hydrogen, fluorine, cyano, a substituted or unsubstituted $C_{1-10}$ alkyl, or a substituted or unsubstituted $C_{1-10}$ fluoroalkyl, $L^1$ is a single bond or a divalent linking group, A is a divalent linking group;

$Z^-$ is an anionic moiety comprising sulfonate, an anion of a sulfonamide, an anion of a sulfonimide, or a methide anion; and $G^+$ is an organic cation.

13. The method of claim 12, wherein $-L^1-A-Z^-$ is represented by one of formulae (3) to (5b):

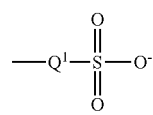

(3)

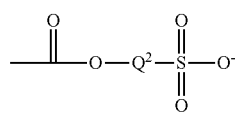

(4)

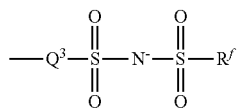

(5a)

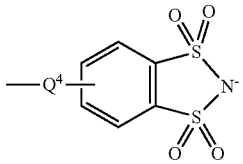

(5b)

wherein, in formulae (3) to (5b), $Q^1$ and $Q^2$ are each independently a fluorine-substituted divalent linking group;

$Q^3$ is a divalent linking group;

$Q^4$ is a single bond or a divalent linking group; and $R^f$ is a fluorine-substituted $C_{1-30}$ alkyl, a fluorine-substituted $C_{3-30}$ cycloalkyl, or a single bond forming a ring with $Q^3$.

14. The method of claim 12, wherein $G^+$ is a cation represented by one of formulae (6), (7), or (8):

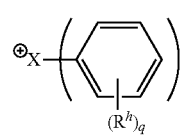

(6)

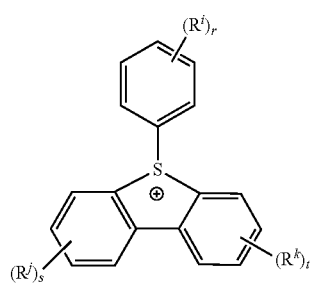

(7)

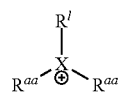

(8)

wherein, in formulae (6), (7), and (8):

X is I or S;

$R^h$, $R^i$, $R^j$, and $R^k$ are each independently hydroxy, nitrile, halogen, substituted or unsubstituted $C_{1-30}$ alkyl, substituted or unsubstituted $C_{1-30}$ fluoroalkyl, substituted or unsubstituted $C_{3-30}$ cycloalkyl, substituted or unsubstituted $C_{1-30}$ fluorocycloalkyl, substituted or unsubstituted $C_{1-30}$ alkoxy, substituted or unsubstituted $C_{3-30}$ alkoxycarbonylalkyl, substituted or unsubstituted $C_{3-30}$ alkoxycarbonylalkoxy, substituted or unsubstituted $C_{3-30}$ cycloalkoxy, substituted or unsubstituted $C_{5-30}$ cycloalkoxycarbonylalkyl, substituted or unsubstituted $C_{5-30}$ cycloalkoxycarbonylalkoxy, substituted or unsubstituted $C_{1-30}$ fluoroalkoxy, substituted or unsubstituted $C_{3-30}$ fluoroalkoxycarbonylalkyl, substituted or unsubstituted $C_{3-30}$ fluoroalkoxycarbonylalkoxy, substituted or unsubstituted $C_{3-30}$ fluorocycloalkoxy, substituted or unsubstituted $C_{5-30}$ fluorocycloalkoxycarbonylalkyl, substituted or unsubstituted $C_{5-30}$ fluorocycloalkoxycarbonylalkoxy, substituted or unsubstituted $C_{6-30}$ aryl, $C_{6-30}$ fluoroaryl, substituted or unsubstituted $C_{6-30}$ aryloxy, or substituted or unsubstituted $C_{6-30}$ fluoroaryloxy;

each $R^{aa}$ is independently substituted or unsubstituted $C_{1-20}$ alkyl, substituted or unsubstituted $C_{1-20}$ fluoroalkyl, substituted or unsubstituted $C_{3-20}$ cycloalkyl, substituted or unsubstituted $C_{3-20}$ fluorocycloalkyl, substituted or unsubstituted $C_{2-20}$ alkenyl, substituted or unsubstituted $C_{2-20}$ fluoroalkenyl, substituted or unsubstituted $C_{6-30}$ aryl group, substituted or unsubstituted $C_{6-30}$ fluoroaryl, substituted or unsubstituted $C_{6-30}$ iodoaryl, substituted or unsubstituted $C_{4-30}$ heteroaryl, substituted or unsubstituted $C_{7-20}$ arylalkyl, substituted or unsubstituted $C_{7-20}$ fluoroarylalkyl, substituted or unsubstituted $C_{5-30}$ heteroarylalkyl, or substituted or unsubstituted $C_{5-30}$ fluoroheteroarylalkyl, wherein each $R^{aa}$ is either separate or connected to another group $R^{aa}$ via a single bond or a divalent linking group to form a ring;

when X is I, p is 2, and $R^1$ is a lone pair of electrons;

when X is S, p is 3, and $R^1$ is a substituted or unsubstituted $C_{6-20}$ aryl group;

q and r are each independently an integer from 0 to 5; and s and t are each independently an integer from 0 to 4.

15. The coated substrate of claim 1, wherein the second repeating unit comprises a hydroxy-substituted $C_{1-30}$ alkyl group, or a hydroxy-substituted $C_{6-30}$ aryl group.

* * * * *